US008817529B2

(12) United States Patent  
Aoki

(10) Patent No.: US 8,817,529 B2  
(45) Date of Patent: Aug. 26, 2014

(54) MAGNETIC MEMORY DEVICE AND READING METHOD OF MAGNETIC MEMORY DEVICE

(71) Applicant: Fujitsu Limited, Kawasaki (JP)

(72) Inventor: Masaki Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 37 days.

(21) Appl. No.: 13/647,522

(22) Filed: Oct. 9, 2012

(65) Prior Publication Data

US 2013/0155761 A1 Jun. 20, 2013

(30) Foreign Application Priority Data

Dec. 14, 2011 (JP) ................................. 2011-273648

(51) Int. Cl.  
*G11C 11/00* (2006.01)

(52) U.S. Cl.  
USPC ........................... 365/158; 365/171; 365/173

(58) Field of Classification Search  
USPC .................. 365/158, 171, 173, 189.07, 210.1  
See application file for complete search history.

(56) References Cited

U.S. PATENT DOCUMENTS

| 7,145,795 | B2 * | 12/2006 | Ghodsi ......................... 365/158 |
| 2002/0036925 | A1 | 3/2002 | Tanzawa et al. |
| 2008/0019192 | A1 * | 1/2008 | Wang et al. .............. 365/189.06 |
| 2009/0175108 | A1 * | 7/2009 | Dittrich ...................... 365/210.1 |

FOREIGN PATENT DOCUMENTS

JP 2002-100192 A1 4/2002

OTHER PUBLICATIONS

T. Ishigaki, et al.; "A Multi-Level-Cell Spin-Transfer Torque Memory with Series-Stacked Magnetotunnel Junctions;" 2010 Symposium on VLSI Technology Digest of Technical Papers; 2010; pp. 47-48 (2 Sheets)/p. 1 of specification.  
K. Tsuchida, et al.; "A 64Mb MRAM with Clamped-Reference and Adequate-Reference Schemes;" 2010 IEEE International Solid-State Circuits Conference; 2010; pp. 258-260 (3 Sheets)/p. 2 of specification.  
A. Bette, et al.; "High-Speed 128Kbit MRAM Core for Future Universal Memory Applications;" 2003 Symposium on VLSI Circuits Digest of Technical Papers; 2003; pp. 4-89114-035-6/03 (4 Sheets)/p. 2 of specification.  
Y. Ueda, et al.; "Design of Low Read Bias Voltage and High Speed Sense Amplifier for STT-MRAM;" The Institute of Electronics, Information and Communication Engineers, IEICE Technical Report; vol. 107; No. 1; 2007; pp. 7-12 and cover sheet (7 Sheets)/p. 2 of specifcation.  
Y. Lee, et al.; "Highly Scalable STT-MRAM with MTJs of Top-pinned Structure in 1T/1MTJ Cell;" 2010 Symposium on VLSI Technology Digest of Technical Papers; 2010; pp. 49-50 (2 Sheets)/p. 2 of specification.

* cited by examiner

*Primary Examiner* — Huan Hoang  
(74) *Attorney, Agent, or Firm* — Kratz, Quintos & Hanson, LLP

(57) ABSTRACT

A magnetic memory device including a multivalued magnetic memory cell whose electric resistances become first to fourth resistance value when first to fourth information are respectively stored, a first reference cell larger than the first resistance value and smaller than the second resistance value, a second reference cell larger than the second resistance value and smaller than the third resistance value, a third reference cell larger than the third resistance value and smaller than the fourth resistance value, and a read circuit including first to third comparators comparing a signal corresponding to the resistance of the magnetic memory cell and respective signals corresponding to the resistances of the first to third reference cells.

13 Claims, 19 Drawing Sheets

FIG. 11

|  | Output1 | Output2 | Output3 |
|---|---|---|---|
| "00" | L | L | L |
| "01" | H | L | L |
| "10" | H | H | L |
| "11" | H | H | H |

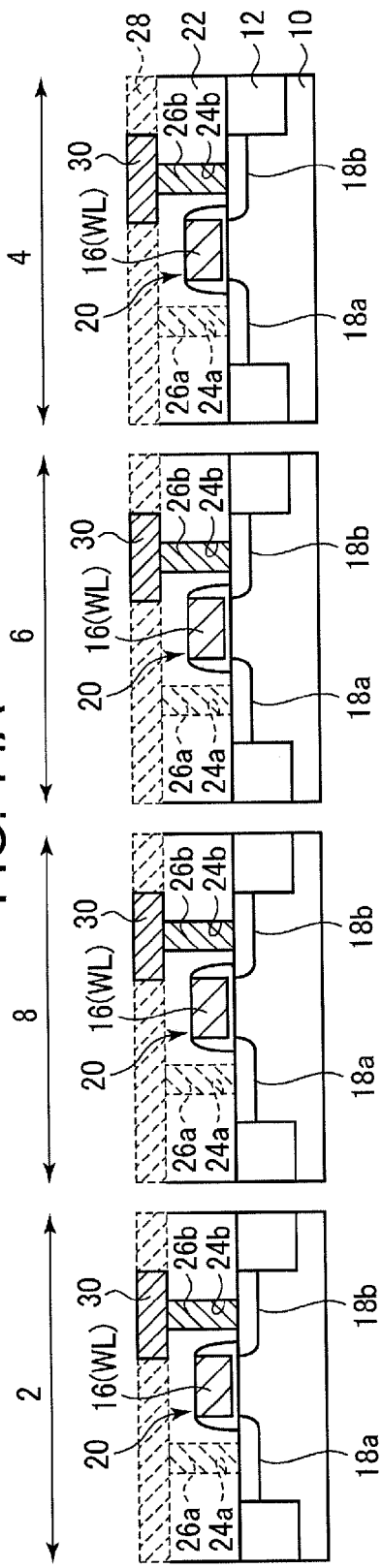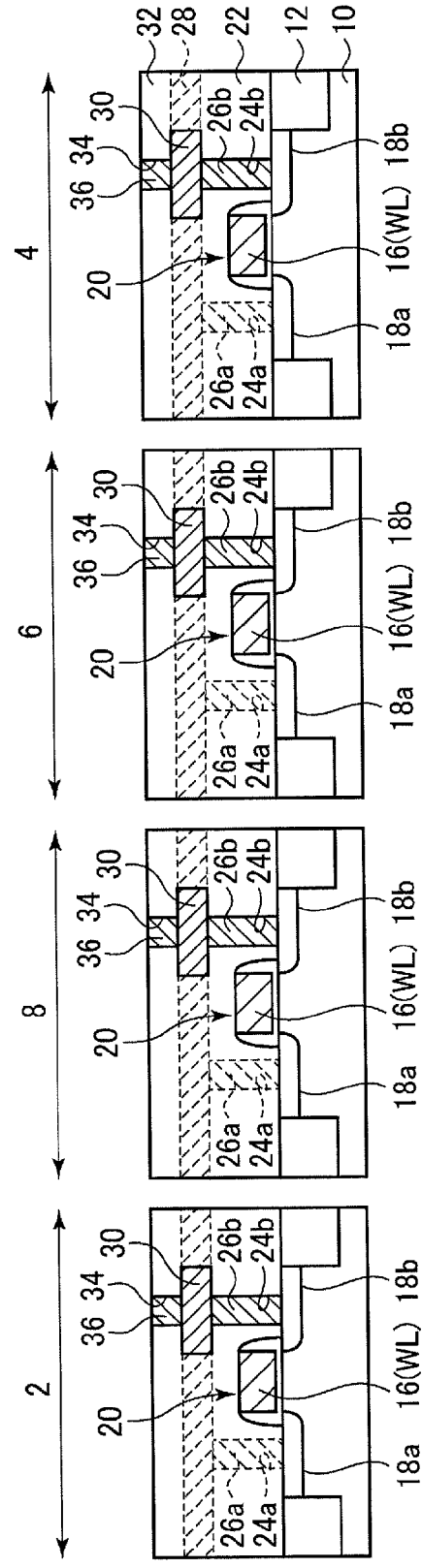

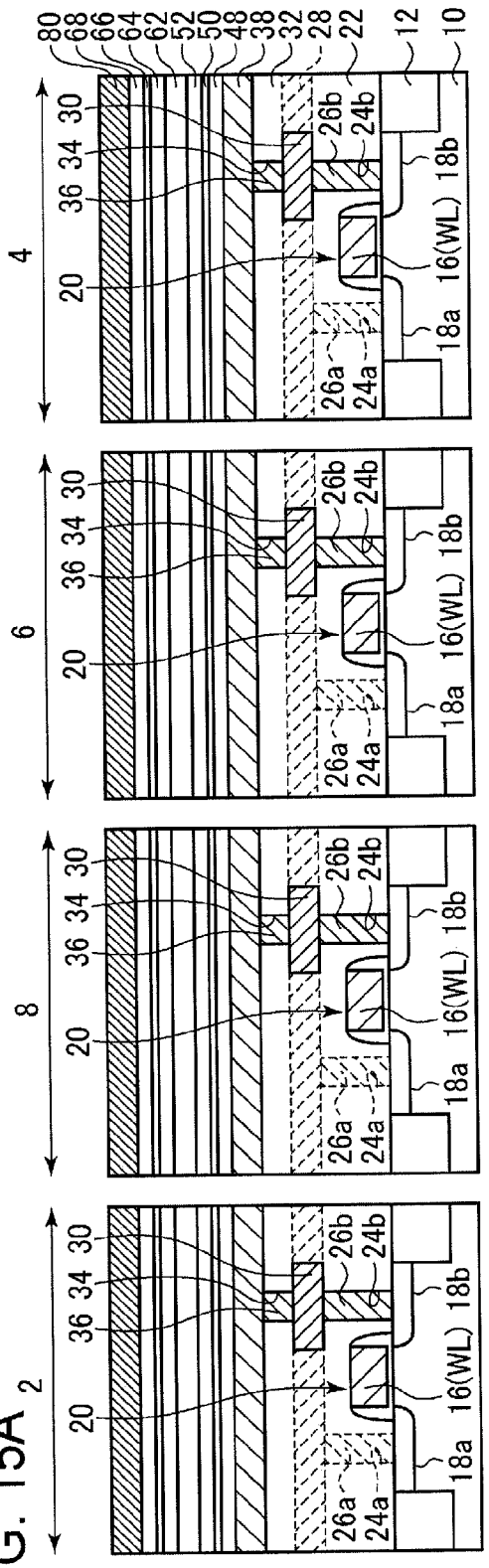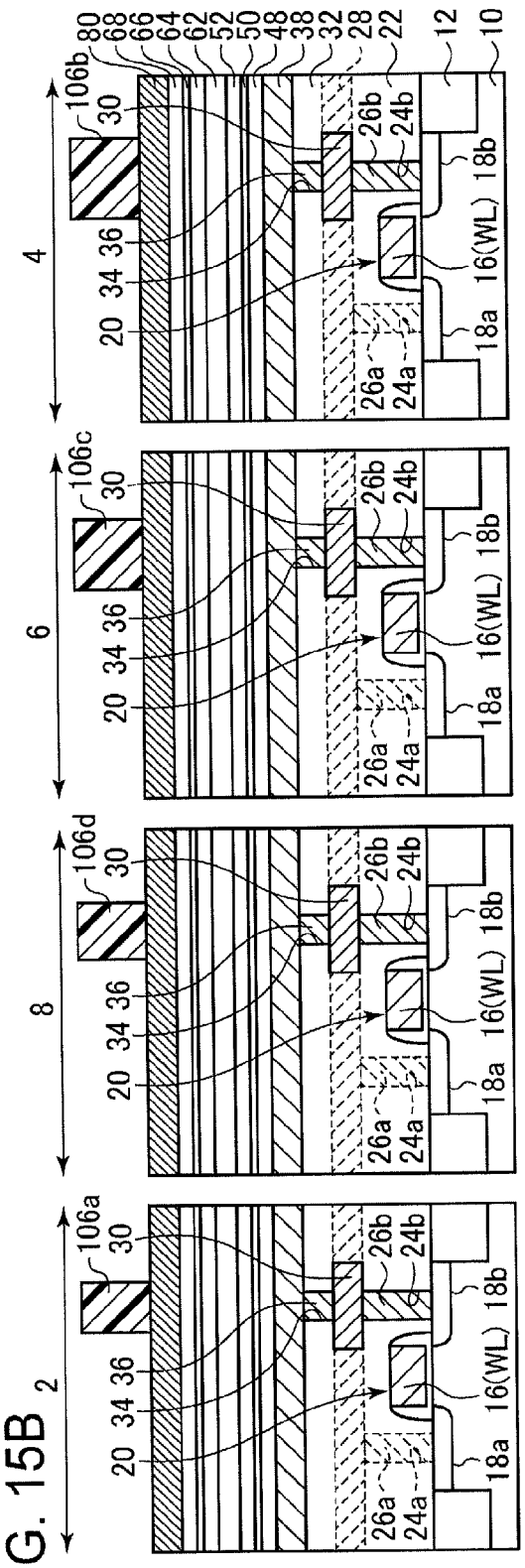

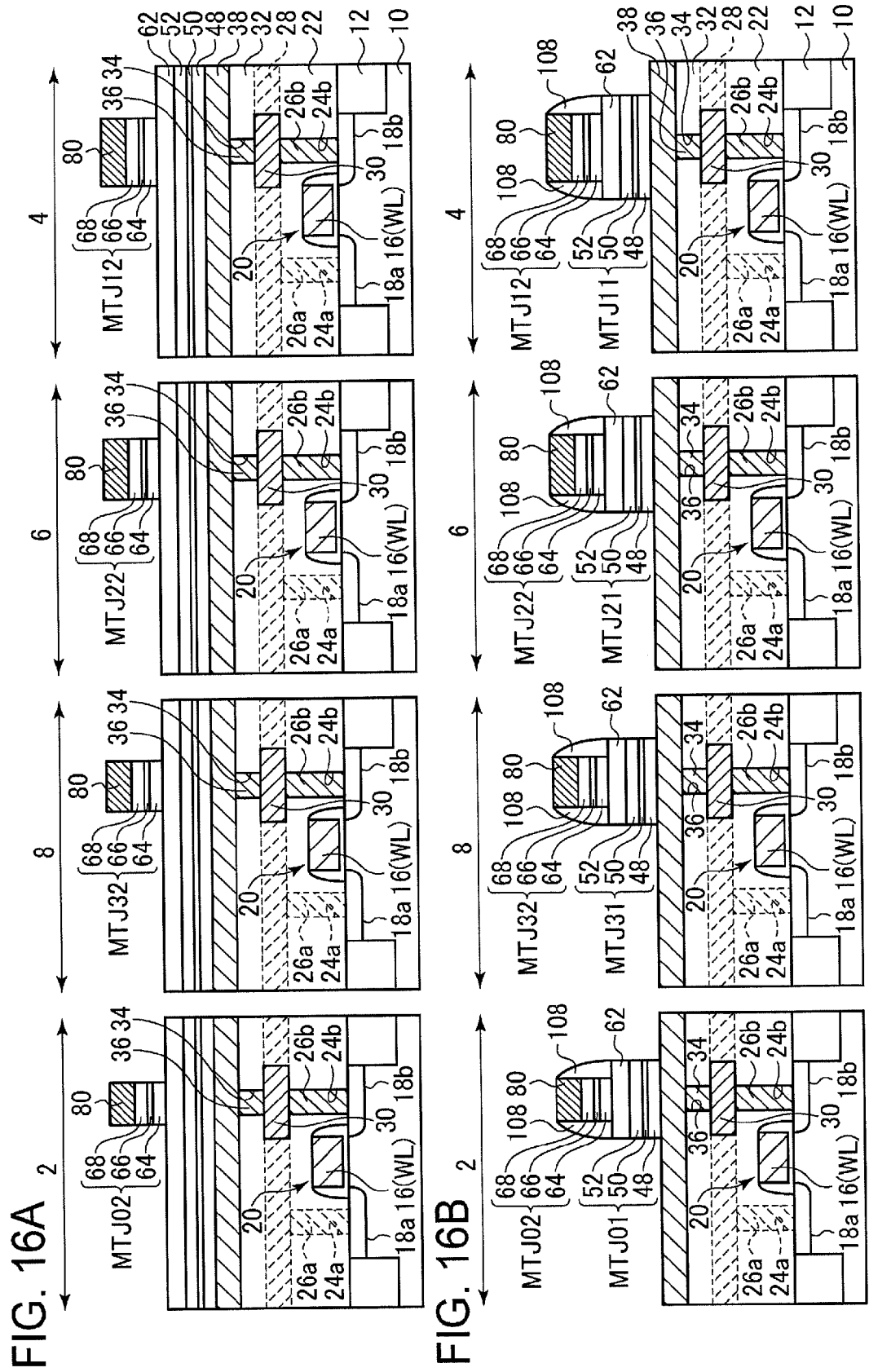

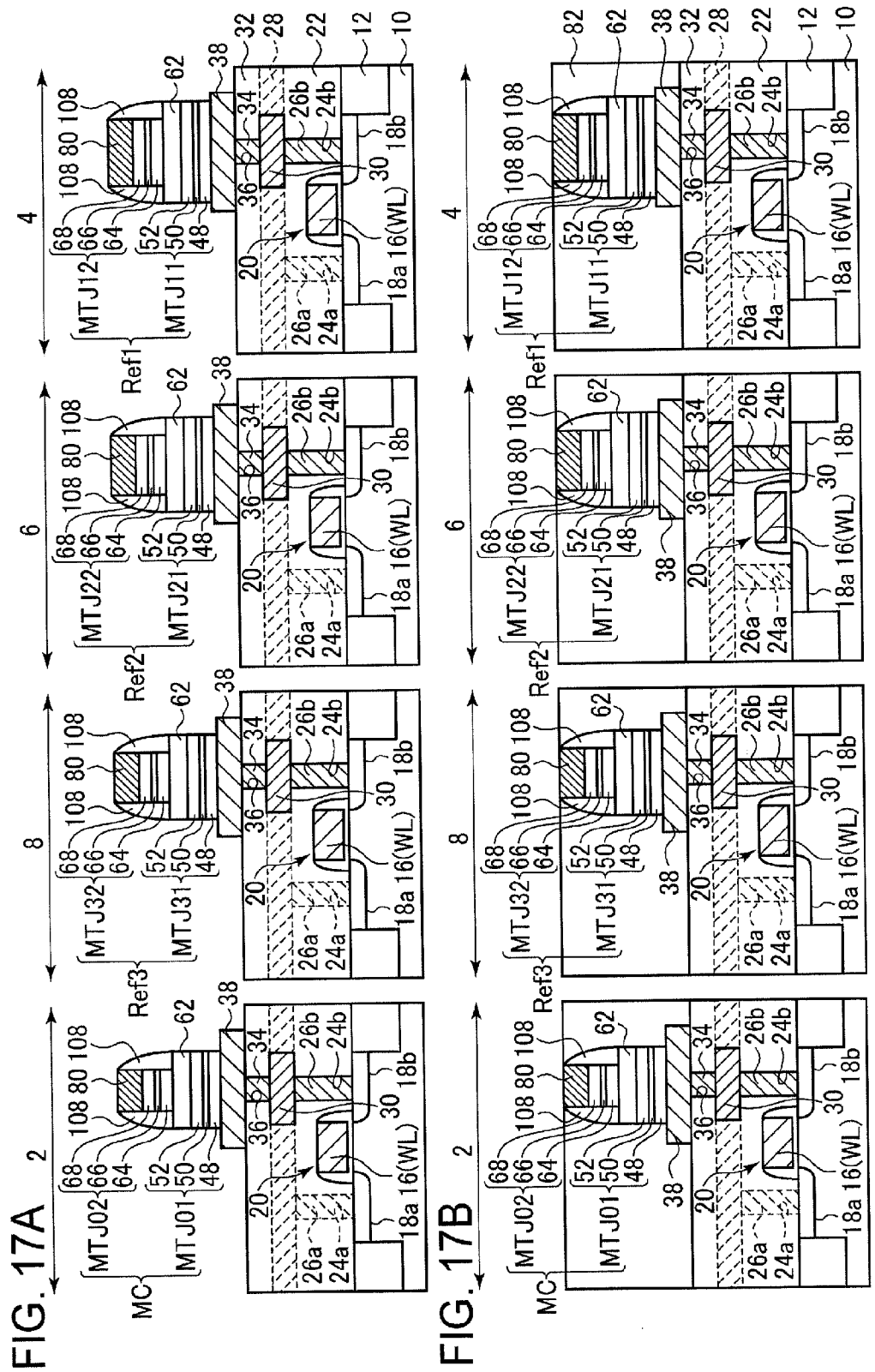

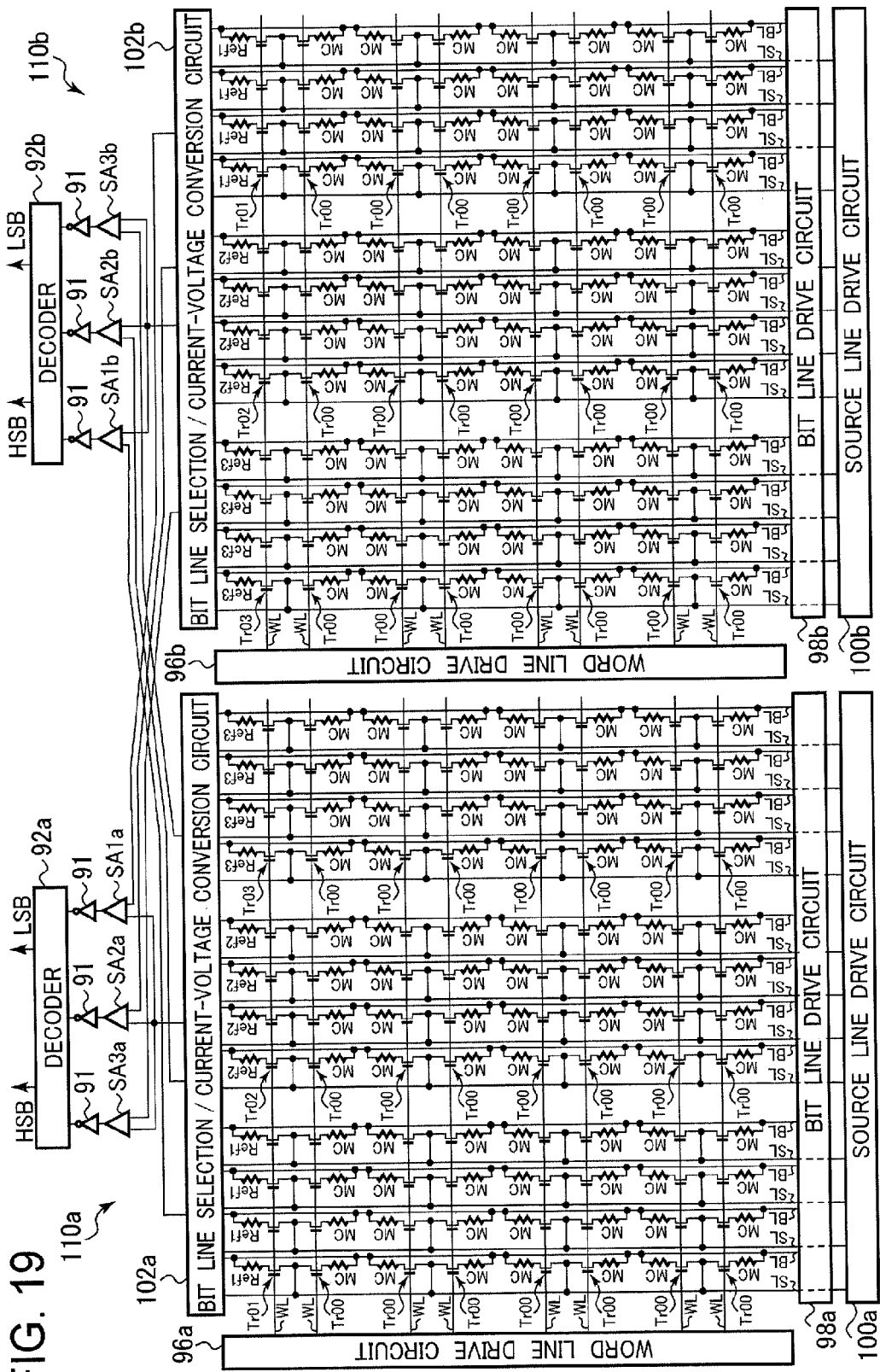

MAGNETIC MEMORY DEVICE AND READING METHOD OF MAGNETIC MEMORY DEVICE

CROSS-REFERENCE TO RELATED APPLICATION

This application is based upon and claims the benefit of priority of the prior Japanese Patent Application No. 2011-273648, filed on Dec. 14, 2011, the entire contents of which are incorporated herein by reference.

FIELD

The embodiments discussed herein are related to a magnetic memory device and reading method of a magnetic memory device.

BACKGROUND

Recently, as a rewritable nonvolatile memory is noted a magnetic random access memory (herein after called "MRAM") including magnetoresistive effect elements arranged in a matrix. MRAM uses combinations of the magnetization directions of 2 magnetic layers to store information and detects resistance changes (i.e., current changes or voltage changes) given when magnetization directions of the magnetic layers are parallel are antiparallel to read stored information.

Recently, memory cells which can store multivalued information are proposed (T. Ishigaki et al., "A Multi-Level-Cell Spin-Transfer Torque Memory with Series-Stacked Magnetotunnel Junctions," 2010 Symposium on VLSI Technology Digest of Technical Papers, pp. 47-48).

Related references are as follows:
Japanese Laid-open Patent Publication No. 2002-100192;
T. Ishigaki et al., "A Multi-Level-Cell Spin-Transfer Torque Memory with Series-Stacked Magnetotunnel Junctions," 2010 Symposium on VLSI Technology Digest of Technical Papers, pp. 47-48;
K. Tsuchida et al., "A 64 Mb MRAM with Clamped-Reference and Adequate-Reference Schemes," 2010 IEEE International Solid-State Circuits Conference Digest of Technical Papers, pp. 258-259;
A. Bette et al., "A High-Speed 128 Kbit MRAM Core for Future Universal Memory Applications," 2003 Symposium on VSLI Circuits Digest of Technical Papers, 4-89114-035-6/03;
Yoshihiro Ueda et al., "Design of Low Read Bias Voltage and High Speed Sense Amplifier for STT-MRAM," The Institute of Electronics, Information and Communication Engineers, IEICE Technical Report, 2007, Vol. 107, No. 1, pp. 7-12; and
Young Min Lee et al., "Highly Scalable STT-MRAM with MTJs of TOP-pinned Structure in 1T/1MTJ Cell," 2010 Symposium on VLSI Technology Digest of Technical Papers, pp. 49-50.

SUMMARY

According to one aspect of an embodiment, a magnetic memory device including a magnetic memory cell which can store multivalued memory information, and whose electric resistance given when memory information of a first value is stored is a first resistance value, whose electric resistance given when memory information of a second value is stored is a second resistance value larger than the first resistance value, whose electric resistance given when memory information of a third value is stored is a third resistance value larger than the second resistance value and whose electric resistance given when memory information of a fourth value is stored is a fourth resistance value larger than the third resistance value; a first reference cell whose electric resistance is set at a fifth resistance value larger than the first resistance value and smaller than the second resistance value; a second reference cell whose electric resistance is set at a sixth resistance value larger than the second resistance value and smaller than the third resistance value; a third reference cell whose electric resistance is set larger than the third resistance value and smaller than the fourth resistance value; and a read circuit for reading the memory information stored in the magnetic memory cell, including a first comparator comparing a signal corresponding to the electric resistance of the magnetic memory cell and a signal corresponding to the electric resistance of the first reference cell with each other, a second comparator comparing a signal corresponding to the electric resistance of the magnetic memory cell and a signal corresponding to the electric resistance of the second reference cell, and a third comparator comparing a signal corresponding to the electric resistance of the magnetic memory cell and a signal corresponding to the electric resistance of the third reference cell.

According to another aspect of an embodiment, a reading method of a magnetic memory device including a magnetic memory cell which can store multivalued memory information, and whose electric resistance given when memory information of a first value is stored is a first resistance value, whose electric resistance given when memory information of a second value is stored is a second resistance value larger than the first resistance value, whose electric resistance given when memory information of a third value is stored is a third resistance value larger than the second resistance value and whose electric resistance given when memory information of a fourth value is stored is a fourth resistance value larger than the third resistance value; a first reference cell whose electric resistance is set at a fifth resistance value larger than the first resistance value and smaller than the second resistance value; a second reference cell whose electric resistance is set at a sixth resistance value larger than the second resistance value and smaller than the third resistance value; and a third reference cell whose electric resistance is set at a seventh resistance value larger than the third resistance value and smaller than the fourth resistance value, the method including comparing a signal corresponding to the electric resistance of the magnetic memory cell and a signal corresponding to the electric resistance of the first reference cell with each other by a first comparator; comparing a signal corresponding to the electric resistance of the magnetic memory cell and a signal corresponding to the electric resistance of the second reference cell with each other by a second comparator; comparing a signal corresponding to the electric resistance of the magnetic memory cell and a signal corresponding to the electric resistance of the third reference cell with each other by a third comparator; and reading the memory information stored in the magnetic memory cell, based on comparison results by the first comparator, the second comparator and the third comparator.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 11 is a view illustrating relationships between an input and an output of a decoder;

FIGS. 13A to 18 are sectional views of the magnetic memory device according to the first embodiment in the steps of the method of manufacturing the magnetic memory cell, which illustrate the method; and FIG. 19 is a circuit diagram of the magnetic memory device according to a second embodiment.

DESCRIPTION OF EMBODIMENTS

As described above, the memory cells which can store the multivalued information are proposed.

However, it is not always easy to speedily read stored multivalued information.

[a] First Embodiment

Figure 1:
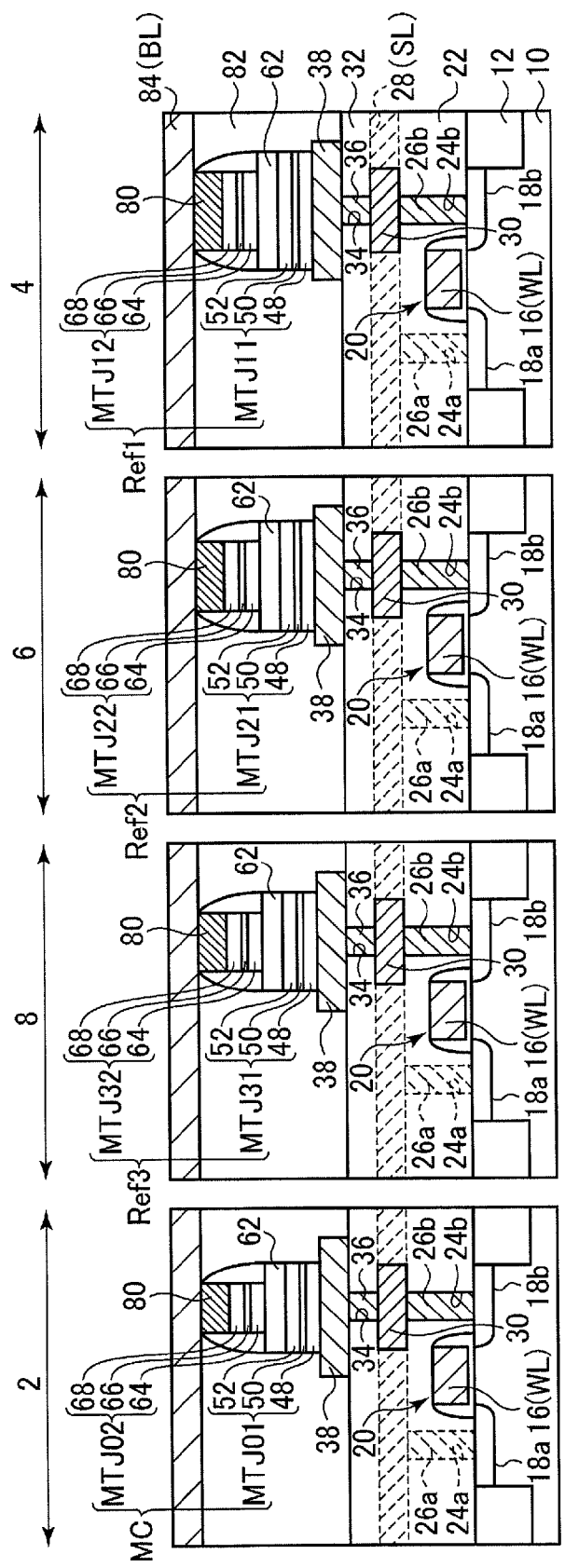
FIG. 1 is a sectional view of a magnetic memory device according to a first embodiment.

The magnetic memory device and its reading method according to a first embodiment will be described with reference to FIGS. 1 to 18. FIG. 1 is a sectional view of the magnetic memory device according to the present embodiment.

The drawing on the left side of FIG. 1 illustrates a region 2 for a magnetic memory cell formed in, and the drawing on the right side of the region 2 for the magnetic memory cell formed in illustrates a region 8 for a third reference cell formed in. The drawing on the right side of the region 8 for the third reference cell formed in illustrates a region 6 for a second reference cell formed in. The drawing on the right side of the region 6 for the second reference cell formed in illustrates a region 4 for a first reference cell formed in.

As illustrated in FIG. 1, device isolation regions 12 defining the device regions are formed in a semiconductor substrate 10.

On the semiconductor substrate 10 with the device isolation regions 12 formed, select transistors 20 each including a gate electrode 16 and source/drain diffused layers 18a, 18b are formed. The gate electrodes 16 act as word lines WL (see FIG. 9). The word lines WL are extended perpendicular as viewed in FIG. 1.

On the semiconductor substrate 10 with the select transistors 20 formed on, an inter-layer insulation film 22 is formed.

In the inter-layer insulation film 22, contact holes 24a, 24b are formed down to the source/drain diffused layers 18a, 18b.

In the contact holes 24a, 24b, conductor plugs 26a, 26b are respectively buried.

On the inter-layer insulation film 22 with the conductor plugs 26a, 26b buried in, a source line (SL) 28 and relay interconnections 30 are formed. The source line is electrically connected to the source diffused layers (source terminals) 18a of the select transistors via the conductor plugs 26a. The relay interconnections 30 are electrically connected to the drain diffused layers (drain terminals) 18b of the select transistors 20 via the conductor plugs 26b. The source line 28 is extended right-to-left as viewed in FIG. 1 and intersect word lines (WL) 16.

On the inter-layer insulation film 22 with the source line 28 and the relay interconnections 30 formed in, an inter-layer insulation film 32 is formed. In the inter-layer insulation film 32, contact holes 34 are formed down to the relay interconnections 30.

In the contact holes 34, conductor plugs 36 connected to the relay interconnections 30 are buried in.

On the inter-layer insulation film 32 with the conductor plugs 36 buried in, the lower electrode 38 of the magnetic memory cell MC, and the lower electrodes 38 of the reference cells (the reference magnetic memory cells) Ref1-Ref3 are formed. The respective lower electrodes 38 are electrically connected to the drains 18b of the select transistors 20 via the conductor plugs 36, the relay interconnections 30 and the conductor plugs 26b.

On the lower electrodes 38 in the region 2 for the magnetic memory cell formed in, the magnetic memory cell MC including a magnetoresistive effect element MTJ01, and a magnetoresistive effect element MTJ02 serially connected to the magnetoresistive effect element MTJ01 is formed.

As the magnetoresistive effect elements MTJ01, MTJ02, magnetoresistive effect elements of, e.g., the spin torque transfer magnetization switching mode are used. As such magnetoresistive effect elements, MTJ (Magnetic Tunnel Junction) element, for examples are used.

The magnetic tunnel junction element is a magnetoresistive effect element including a tunnel barrier layer sandwiched between a magnetization free layer and a magnetization fixed layer.

In the magnetic tunnel junction element, when a current is flowed from the magnetization free layer to the magnetization fixed layer, electrons of a spin of the same direction as the spin of the magnetization fixed layer are injected into the magnetization free layer. Resultantly, the direction of the spin of the magnetization free layer and the direction of the spin of the magnetization fixed layer become same, and the magnetic moment of the magnetization free layer becomes parallel, and the resistance of the magnetic tunnel junction becomes relatively small. The state that the resistance of the magnetic tunnel junction is relatively small (the low resistance state) is related to, e.g., data "0".

On the other hand, when a current is flowed from the magnetization fixed layer to the magnetization free layer, electrons of a spin of the direction opposite to the spin of the magnetization fixed layer are reflected by the magnetization fixed layer and injected into the magnetization free layer. Resultantly, the direction of the spin of the magnetization free layer and the direction of the spin of the magnetization fixed layer become opposite to each other, and the magnetic moment of the magnetization free layer becomes antiparallel, and the resistance of the magnetic tunnel junction becomes relatively high. The state that the resistance of the magnetic tunnel junction is relatively high (the high resistance state) is related to, e.g., data "1".

Figure 2:
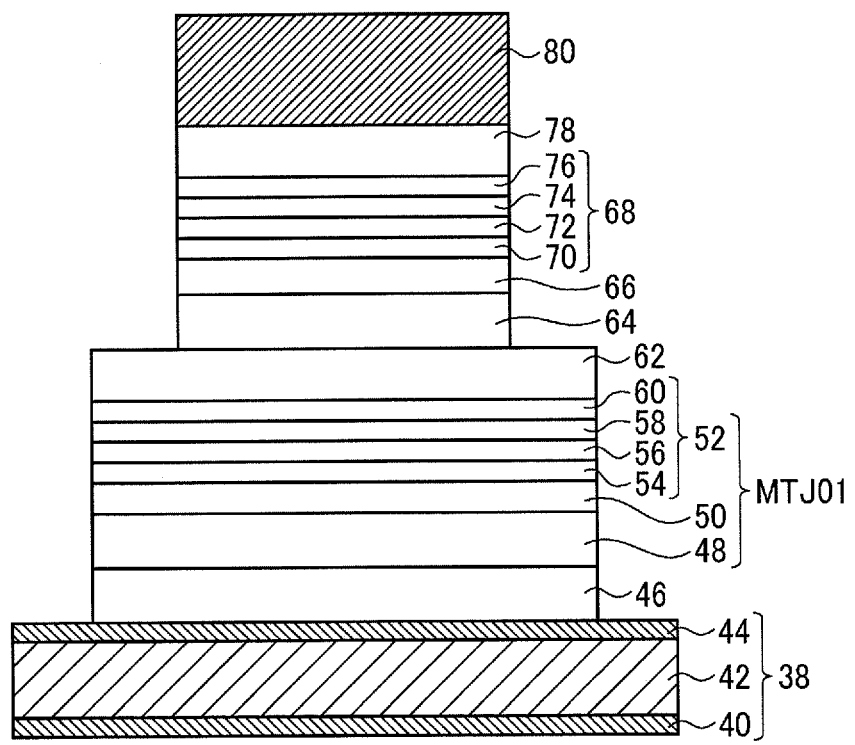
FIG. 2 is a sectional view of a magnetic memory cell of the magnetic memory device according to the first embodiment.

FIG. 2 is a sectional view of the magnetic memory cell of the magnetic memory device according to the present embodiment.

The lower electrode 38 is formed of, e.g., an about 5 nm-film thickness tantalum (Ta) film, e.g., an about 25 nm-film thickness ruthenium (Ru) film 42 and e.g., an about 15 nm-film thickness Ta film 44 are sequentially stacked.

On the lower electrode 38, a buffer layer 46 is formed. As the buffer film 46, an about 8 nm-film thickness Ru film, for example, is used.

On the buffer layer 46, the magnetoresistive effect element MTJ01 including the magnetization free layer 48, the tunnel barrier film 50 formed on the magnetization free layer 48 and the magnetization fixed layer 52 formed on the tunnel barrier layer 50 is formed.

As the magnetization free layer (the magnetic layer, the ferromagnetic layer) 48, an about 1.5 nm-film thickness CoFeB film, for example, is used.

As the tunnel barrier layer (the barrier layer, nonmagnetic layer, the tunnel insulation film) 50, an about 1 nm-film thickness MgO film, for example, is used.

The magnetization fixed layer (the magnetic layer, the ferromagnetic layer) 52 is formed of, e.g., an about 2.5 nm-film thickness CoFeB film 54, an about 1 nm-film thickness Ru film 56, an about 2.6 nm-film thickness CoFe film 58 and an about 8 nm-film thickness IrMn film 60 sequentially stacked.

On the magnetoresistive effect element MTJ01, an intermediate layer 62 is formed. As the intermediate layer 62, an about 5 nm-film thickness Ru film, for example, is used.

On the intermediate layer 62, the magnetoresistive effect element MTJ02 including a magnetization free layer 64, a tunnel barrier layer 66 formed on the magnetization free layer 64 and a magnetization fixed layer 68 formed on the tunnel barrier layer 66 is formed. The area of the magnetoresistive effect element MTJ02 is set small than the area of the magnetoresistive effect element MTJ01.

As the magnetization free layer 64, an about 1.5 nm-film thickness CoFeB film, for example, is used as is the magnetization free layer 48 of the magnetoresistive effect element MTJ01.

As the tunnel barrier layer 66, an about 1 nm-film thickness MgO film, for example, is used as is the tunnel barrier layer 50 of the magnetoresistive effect element MTJ01.

The magnetization fixed layer 68 is the same as the magnetization fixed layer 52 of the magnetoresistive effect element MTJ01. That is, the magnetization fixed layer 68 is formed, e.g., of an about 2.5 nm-film thickness CoFeB film 70, an about 1 nm-film thickness Ru film 72, an about 2.6 nm-film thickness CoFe film 74 and an about 8 nm-film thickness IrMn film 76 sequentially stacked.

On the magnetoresistive effect element MTJ02, a cap layer 78 is formed. The cap layer 78 is formed of, e.g., an about 7 nm-film thickness Ru film.

On the cap layer 78, an upper electrode 80 is formed. The upper electrode 80 is formed of, e.g., an about 40 nm-film thickness Ta film.

Thus, the magnetic memory cell MC having the magnetoresistive effect element MTJ01 and the magnetoresistive effect element MTJ02 serially connected is formed.

On the inter-layer insulation film 32 with the magnetic memory cell MC formed on, an inter-layer insulation film 82 is formed, burying the magnetic memory cell MC.

The upper electrode 80 of the magnetic memory cell MC is exposed out of the inter-layer insulation film 82.

On the inter-layer insulation film 82 with the magnetic memory cell MC buried in, a bit line (BL) 84 is formed. The bit line 84 is extended left-to-right as viewed in FIG. 1.

Figure 3:
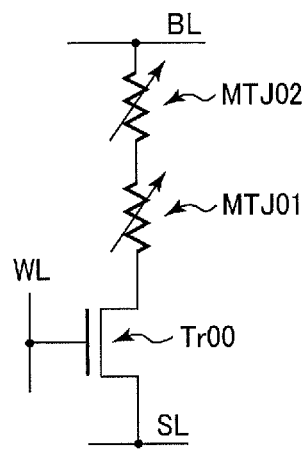
FIG. 3 is a circuit diagram of the magnetic memory cell of the magnetic memory device according to the first embodiment.

FIG. 3 is a circuit diagram of the magnetic memory cell of the magnetic memory device according to the present embodiment.

As illustrated in FIG. 3, the magnetoresistive effect element MTJ01 and the magnetoresistive effect element MTJ02 are serially connected. One end of the magnetoresistive effect element MTJ01 is electrically connected to the drain of the select transistor Tr00.

The select transistor Tr00 in FIG. 3 corresponds to the select transistor 20 in FIG. 1.

The gate of the select transistor Tr00 is connected to the word line WL.

The source of the select transistor Tr00 is connected to the source line SL.

The other end of the magnetoresistive effect element MTJ01 and the other end of the magnetoresistive effect element MTJ02 are electrically connected to each other.

The other end of the magnetoresistive effect element MTJ02 is electrically connected to the bit line BL.

Figures 4A, 4B:
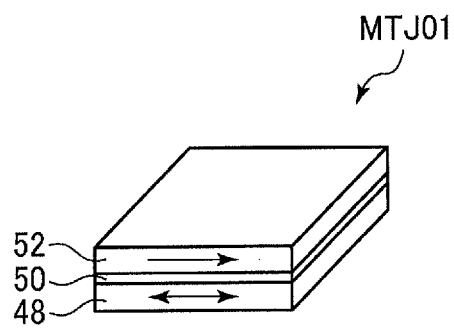
FIG. 4A is a diagrammatic perspective view of a magnetoresistive effect element (Part 1)
FIG. 4B is a graph of the resistance-current characteristics of the magnetoresistive effect element (Part 1)

FIGS. 4A and 4B are views of the resistance-current characteristics of the magnetoresistive effect elements (Part 1). On the horizontal axis in FIG. 4B, the amount of the current to be flowed to the magnetoresistive effect element MTJ01 are taken, and on the vertical axis in FIG. 4B, the electric resistance of the magnetoresistive effect element MTJ01 is taken. FIG. 4A is a diagrammatic perspective view of the magnetoresistive effect element MTJ01. FIG. 4B is the graph of the resistance-current characteristics of the magnetoresistive effect element MTJ01.

With the magnetoresistive effect element MTJ01 being in the low resistance state, when a current larger than a threshold current IC1 is flowed from the magnetization fixed layer 52 toward the magnetization free layer 48, the magnetoresistive effect element MTJ01 is shifted to the low resistance state to the high resistance state.

On the other hand, with the magnetoresistive effect element MTJ01 being in the high resistance state, when a current larger than the threshold current IC1 is flowed from the magnetization free layer 48 toward the magnetization fixed layer 52, the magnetoresistive effect element MTJ01 changes from the high resistance state to the low resistance state.

Figure 5A:
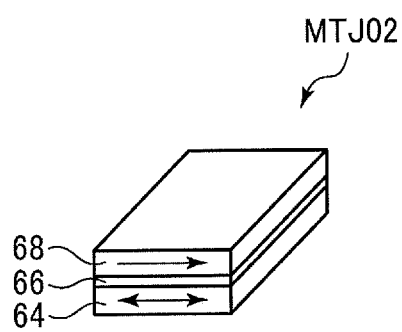
FIG. 5A is a diagrammatic perspective view of a magnetoresistive effect element (Part 2)
Figure 5B:
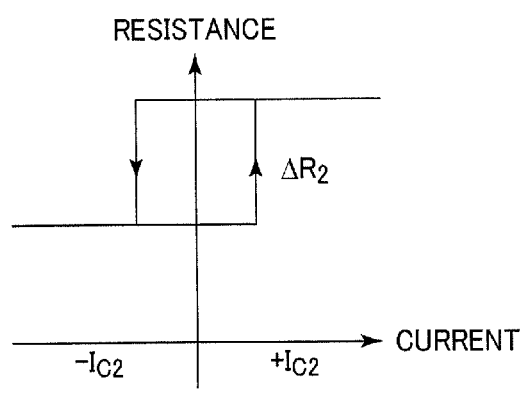
FIG. 5B is a graph of the resistance-current characteristics of the magnetoresistive effect element (Part 2)

FIGS. 5A and 5B are views of the resistance-current characteristics of the magnetoresistive effect element (Part 2). On the horizontal axis in FIG. 5B, the amount of the current to be flowed to the magnetoresistive effect element MTJ02, and on the vertical axis in FIG. 5B, the electric resistance of the magnetoresistive effect element MTJ02 is taken. FIG. 5A is a diagrammatic perspective view of the magnetoresistive effect element MTJ02. FIG. 5B is the graph of the resistance-current characteristics of the magnetoresistive effect element MTJ02.

With the magnetoresistive effect element MTJ02 being in the low resistance state, when a current larger than a threshold current IC2 is flowed from the magnetization fixed layer 68 to the magnetization free layer 64, the magnetoresistive effect element MTJ02 changes from the low resistance state to the high resistance state.

On the other hand, with the magnetoresistive effect element MTJ02 being in the high resistance state, when a current larger than the threshold current IC2 is flowed from the magnetization free layer 64 toward the magnetization fixed layer 68, the magnetoresistive effect element MTJ02 changes from the high resistance state to the low resistance state.

The area of the magnetoresistive effect element MTJ02 is set smaller than the area of the magnetoresistive effect element MTJ01. Accordingly, the absolute value of the threshold current IC2 required to change the resistance state of the magnetoresistive effect element MTJ02 is smaller than the absolute value of the threshold current IC1 required to change the resistance state of the magnetoresistive effect element MTJ01. The resistance value of the magnetoresistive effect element MTJ01 in the low resistance state is smaller than the resistance value of the magnetoresistive effect element MTJ02 in the low resistance state. The resistance value of the magnetoresistive effect element MTJ01 in the high resistance state is smaller than the resistance value of the magnetoresistive effect element MTJ02 in the high resistance state.

Figure 6A:
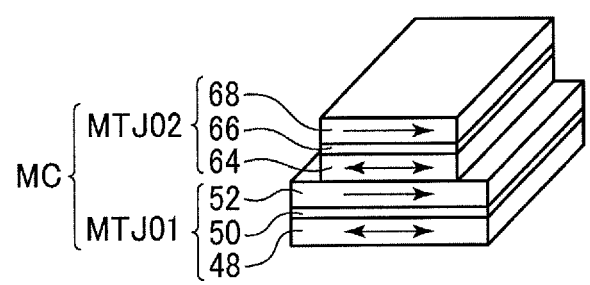
FIG. 6A is a diagrammatic perspective view of a magnetic memory cell of the magnetic memory device according to the first embodiment.
Figure 6B:
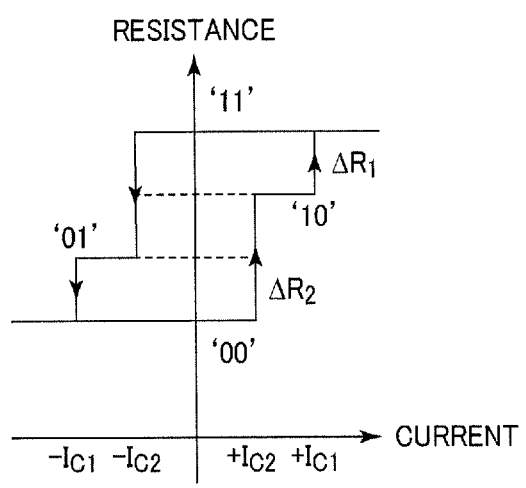
FIG. 6B is a graph of the resistance-current characteristics of the magnetic memory cell of the magnetic memory device according to the first embodiment.

FIGS. 6A and 6B are views of the resistance-current characteristics of the magnetic memory cell of the magnetic memory device according to the present embodiment. On the horizontal axis in FIG. 6B, the current is taken, and on the vertical axis in FIG. 6B, the electric resistance is taken. FIG. 6A is a diagrammatic perspective view of the magnetic memory cell MC. FIG. 6B is the graph of the resistance-current characteristics of the magnetic memory cell MC.

The magnetic memory cell MC includes the magnetoresistive effect element MTJ01 and the magnetoresistive effect element MTJ02 serially connected. Accordingly, in the magnetic memory cell MC, the resistance-current characteristics combining the resistance-current characteristics of the magnetoresistive effect element MTJ01 and the resistance-current characteristics of the magnetoresistive effect element MTJ02 can be given.

The low resistance states of the magnetoresistive effect elements MTJ01, MTJ02 are related to, e.g., data "0". On the other hand, the high resistance states of the magnetoresistive effect elements MTJ01, MTJ02 are related to, e.g., data "1". The data written in the magnetoresistive effect element MTJ01 corresponds to, e.g., the lower bit of memory information stored in the magnetic memory cell MC. The information written in the magnetoresistive effect element MTJ02 corresponds to, e.g., the upper bit of the memory information stored in the magnetic memory cell MC. Thus, the magnetic memory cell MC can store memory information "00", "01", "10" and "11", i.e., multivalued information.

As illustrated in FIG. 1, on the lower electrode 38 in the region 4 for the first reference cell formed in, the reference cell Ref1 including the magnetoresistive effect element MTJ11, and the MTJ12 serially connected to the magnetoresistive effect element MTJ11 is formed. The structures of the respective layers of the first reference cell Ref1 are the same as those of the magnetic memory cell MC. In the first reference cell Ref1 as well as in the magnetic memory cell MC, the area of the magnetoresistive effect element MTJ12 is set smaller than the area of the magnetoresistive effect element MTJ11. The first reference cell Ref1 as well as the magnetic memory cell MC can store multivalued information. The size (area) of the first reference cell Ref1 is so set that the resistance value upon the storage of "11" in the first reference cell Ref1 becomes larger than the resistance value upon the storage of "00" in the magnetic memory cell MC and becomes smaller than the resistance value upon the storage of "01" in the magnetic memory cell MC.

On the lower electrode 38 in the region 6 for the second reference cell formed in, the second reference cell Ref2 including the magnetoresistive effect element MTJ21 and the magnetoresistive effect element MTJ22 serially connected to the magnetoresistive effect element MTJ21 is formed. The structures of the respective layers of the second reference cell Ref2 are the same as those of the magnetic memory cell MC. In the second reference cell Ref2 as well as in the magnetic memory cell MC, the area of the magnetoresistive effect element MTJ22 is set smaller than the area of the magnetoresistive effect element MTJ21. The second reference cell Ref2 as well as the magnetic memory cell MC can store multivalued information. The size (area) of the second reference cell Ref2 is so set that the resistance value upon the storage of "11" in the second reference cell Ref2 becomes larger than the resistance value upon the storage of "01" in the magnetic memory cell MC and becomes smaller than the resistance value upon the storage of "10" in the magnetic memory cell MC.

On the lower electrode 38 in the region 8 for the third reference cell formed in, the third reference cell Ref3 including the magnetoresistive effect element MTJ31, and the magnetoresistive effect element MTJ32 serially connected to the magnetoresistive effect element MTJ31 is formed. The structures of the respective layers of the third reference cell Ref3 are the same as those of the respective layers of the magnetic memory cell MC. In the third reference cell Ref3 as well as the magnetic memory cell MC, the area of the magnetoresistive effect element MTJ32 is set smaller than the area of the magnetoresistive effect element MTJ31. The third reference cell Ref3 as well as the magnetic memory cell MC can store multivalued information. The size (area) of the third reference cell Ref3 is so set that the resistance value upon the storage of "11" in the third reference cell Ref3 becomes larger than the resistance value upon the storage of "10" in the magnetic memory cell MC and becomes smaller than the resistance value upon the storage of "11" in the magnetic memory cell MC.

As described above, the size of the first reference cell Ref1 is so set that the resistance value upon the storage of "11" in the first reference cell Ref1 becomes larger than the resistance value upon the storage of "00" in the magnetic memory cell MC and becomes smaller than the resistance value upon the storage of "01" in the magnetic memory cell MC. The size of the second reference cell Ref2 is so set that the resistance value upon the storage of "11" in the second reference cell Ref2 becomes larger than the resistance value upon the storage of "01" in the magnetic memory cell MC and becomes smaller than the resistance value upon the storage of "10" in the magnetic memory cell MC. The size of the third reference cell Ref3 is so set that the resistance value upon the storage of "11" in the third reference cell Ref3 becomes larger than the resistance value upon the storage of "10" in the magnetic memory cell MC and becomes smaller than the resistance value upon the storage of "11" in the magnetic memory cell MC.

Thus, the size (area) of the third reference cell Ref3 is set larger than the area of the magnetic memory cell MC. More specifically, the area of the magnetoresistive element MTJ31 of the third reference cell Ref3 is set larger than the area of the magnetoresistive effect element MTJ01 of the magnetic memory cell MC. The area of the magnetoresistive effect element MTJ32 of the third reference cell Ref3 is set larger than the area of the magnetoresistive effect element MTJ02 of the magnetic memory cell MC.

The area of the second reference cell Ref2 is set larger than the area of the third reference cell Ref3. More specifically, the area of the magnetoresistive effect element MTJ21 of the second reference cell Ref2 is set larger than the area of the magnetoresistive effect element MTJ31 of the third reference cell Ref3. The area of the magnetoresistive effect element MTJ22 of the second reference cell Ref2 is set larger than the area of the magnetoresistive effect element MTJ32 of the third magnetoresistive effect element Ref3.

The area of the first reference cell Ref1 is set larger than the area of the second reference cell Ref2. More specifically, the area of the magnetoresistive effect element MTJ11 of the first reference cell Ref1 is set larger than the area of the magnetoresistive effect element MTJ21 of the second reference cell Ref2. The area of the magnetoresistive effect element MTJ12 of the first reference cell Ref1 is set larger than the area of the magnetoresistive effect element MTJ22 of the second magnetoresistive effect element Ref2.

The resistance value given when the magnetoresistive effect element MTJ01 of the magnetic memory cell MC is in the low resistance state is set at, e.g., about 1.8 k$\Omega$. The resistance value given when the magnetoresistive effect element MTJ01 of the magnetic memory cell MC is in the high resistance state is set at, e.g., about 4.0 k$\Omega$. The resistance value given when the magnetoresistive effect element MTJ02 of the magnetic memory cell MC is set at, e.g., about 3.6 k$\Omega$. The resistance value given when the magnetoresistive effect element MTJ02 of the magnetic memory cell MC is in the high resistance state is set at, e.g., 7.9 k$\Omega$.

When the memory information "00" (the first memory information) is stored in the magnetic memory cell MC, the magnetoresistive effect element MTJ01 is set in the low resistance state, and the magnetoresistive effect element MTJ02 is set in the low resistance state. In this case, the total value of the resistance value given when the magnetoresistive effect element MTJ01 is in the low resistance state and the resistance value given when the magnetoresistive effect element MTJ02 is in the low resistance state is the resistance value (the first resistance value) of the magnetic memory cell MC. In the case that the resistance value given when the magnetoresistive effect element MTJ01 is in the low resistance state is, e.g., 1.8 k$\Omega$, and the resistance value given when the magnetoresistive effect element MTJ02 is in the low resistance state is about 3.6 k$\Omega$, the resistance value of the magnetic memory cell MC becomes, e.g., 5.4 k$\Omega$.

When the memory information "01" (the second memory information) is stored in the magnetic memory cell MC, the magnetoresistive effect element MTJ01 is set in the high resistance state, and the magnetoresistive element MTJ02 is set in the low resistance state. In this case, the total value of the resistance value given when the magnetoresistive effect element MTJ01 is in the high resistance state and the resistance value given when the magnetoresistive effect element MTJ02 is in the low resistance state becomes the resistance value (the second resistance value) of the magnetic memory cell MC. In the case that the resistance value given when the magnetoresistive effect element MTJ01 is in the low resistance state is, e.g., 4.0 k$\Omega$, and the resistance value given when the magnetoresistive effect element MTJ02 is in the low resistance state is, e.g., 3.6 k$\Omega$, the resistance value of the magnetic memory cell MC becomes, e.g., 7.6 k$\Omega$.

When the memory information of "10" is formed in the magnetic memory cell MC, the magnetoresistive effect element MTJ01 is set in the low resistance state, and the magnetoresistive effect element MTJ02 is set in the high resistance state. In this case, the total value of the resistance value given when the magnetoresistive effect element MTJ01 is in the low resistance state and the resistance value given when the magnetoresistive effect element MTJ02 in the high resistance state becomes the resistance value of the magnetic memory cell MC (the third resistance value). In the case that the resistance value given when the magnetoresistive effect element MTJ01 is in the low resistance state is, e.g., 1.8 k$\Omega$, and the resistance value given when the magnetoresistive effect element MTJ02 is in the high resistance state is, e.g., 7.9 k$\Omega$, the resistance value of the magnetic memory cell MC becomes, e.g., 9.7 k$\Omega$.

When the memory information of "11" (the fourth memory information) is stored in the magnetic memory cell MC, the magnetoresistive effect element MTJ01 is set in the high resistance state, and the magnetoresistive effect element MTJ02 is set in the high resistance state. In this case, the total value of the resistance value given when the magnetoresistive effect element MTJ01 is in the high resistance state and the resistance value given when the magnetoresistive effect element MTJ02 is in the high resistance state is the resistance value (the fourth resistance value) of the magnetic memory cell. In the case that the resistance value given when the magnetoresistive effect element MTJ01 is in the high resistance state is, e.g., 4.0 k$\Omega$, and the resistance value given when the magnetoresistive effect element MTJ02 is in the high resistance state is, e.g., 7.9 k$\Omega$, the resistance value of the magnetic memory cell MC becomes, e.g., 11.9 k$\Omega$.

The reference cells Ref1-Ref3 are used to judge memory information stored in the magnetic memory cell MC. Accordingly, the resistance value of the first reference cell Ref1 is set at the fifth resistance value which is larger than the first resistance value and smaller the second resistance value. That is, the resistance value (the fifth resistance value) of the first reference cell Ref1 is set larger than the resistance value (the first resistance value) given when "00" is written in the magnetic memory cell MC and smaller than the resistance value (the second resistance value) given when "01" is written in the magnetic memory cell MC.

The resistance value of the second reference cell Ref2 is set at the sixth resistance value which is larger than the second resistance value and smaller than the third resistance value. That is, the resistance value (the sixth resistance value) of the second reference cell Ref2 is set larger than the resistance value (the second resistance value) given when "01" is written in the magnetic memory cell MC and smaller than the resistance value (the third resistance value) given when "10" is written in the magnetic memory cell MC.

The resistance value of the third reference cell Ref3 is set at the seventh resistance value which is larger than the third resistance value and smaller than the fourth resistance value. That is the resistance value (the seventh resistance value) of the third reference cell Ref3 is set larger than the resistance value (the third resistance value) given when "10" is written in the magnetic memory cell MC and smaller than the resistance value (the fourth resistance value) given when "11" is written in the magnetic memory cell MC.

The magnetoresistive effect elements MTJ11, MTJ12, MTJ21, MTJ22, MTJ31, MTJ32 of the respective reference cells Ref1-Ref3 are set all in the high resistance state. Accordingly, in the first reference cell Ref1, the resistance value given when the magnetoresistive effect element MTJ11 is in the high resistance state and the magnetoresistive effect element MTJ12 is in the high resistance state become the fifth resistance value described above. In the second reference cell Ref2, the resistance value given when the magnetoresistive effect element MTJ21 is in the high resistance state, and the magnetoresistive effect element MTJ22 is in the high resistance state becomes the sixth resistance value described above. In the third reference cell Ref3, the resistance value given when the magnetoresistive effect element MTJ31 is in the high resistance state, and the magnetoresistive effect element MTJ32 is in the high resistance state becomes the seventh resistance value described above.

The area of the first reference cell Ref1 is set, e.g., about 1.8 times the area of the magnetic memory cell MC. Then, the memory information of "11" is written in the first reference cell Ref1. That is, the magnetoresistive effect elements MTJ11, MTJ12 of the first reference cell Ref1 are all set in the high resistance state. Then, the resistance value of the first reference cell Ref1 becomes, e.g., about 6.5 kΩ. With the first resistance value being, e.g., 5.4 kΩ and with the second resistance value being, e.g., 7.6 kΩ, the resistance value (the fifth resistance value) of the first reference cell Ref1 becomes a suitable resistance value which is larger than the first resistance value and smaller than the second resistance value.

The area of the first reference cell Ref1 is not essentially about 1.8 times the area of the magnetic memory cell MC. The area of the first reference cell Ref1 may be so set suitably that the resistance value of the first reference cell Ref1 given when the memory information of "11" is written in the first reference cell Ref1 becomes larger than the first resistance value and smaller than the second resistance value.

The area of the second reference cell Ref2 is set at, e.g., about 1.4 times the area of the magnetic memory cell MC. Then, the memory information of "11" is written in the second reference cell Ref2. That is the magnetoresistive effect elements MTJ21, MTJ22 of the second reference cell Ref2 are all set in the high resistance state. Then, the resistance value of the second reference cell Ref2 becomes, e.g., about 8.7 kΩ. With the second resistance value being, e.g., 7.6 kΩ and with the third resistance value being, e.g., 9.7 kΩ, the resistance value (the sixth resistance value) of the second reference cell Ref2 becomes a suitable resistance value which is larger than the second resistance value and smaller than the third resistance value.

The area of the second reference cell Ref2 is not essentially about 1.4 times the area of the magnetic memory cell MC. The area of the second reference cell Ref2 may be so set suitably that the resistance value of the second reference cell Ref2 given when the memory information of "11" is written in the second reference cell Ref2 becomes larger than the second resistance value and smaller than the third resistance value.

The area of the third reference cell Ref3 is set at, e.g., about 1.1 times the area of the magnetic memory cell MC. Then, the memory information of "11" is written in the third reference cell Ref3. That is, the magnetoresistive effect elements MTJ31, MTJ32 of the third reference cell Ref3 are all set in the high resistance state. Then, the resistance value of the third reference cell Ref3 becomes, e.g., about 10.8 kΩ. With the third resistance value being, e.g., 9.7 E2 and with the fourth resistance value being, e.g., 11.9 kΩ, the resistance value of the third reference cell Ref3 becomes a suitable resistance value which is larger than the third resistance value and smaller than the fourth resistance value.

The area of the third reference cell Ref3 is not essentially about 1.1 times the area of the magnetic memory cell MC. The area of the third reference cell Ref3 may be so set suitably that the resistance value of the third reference cell Ref3 given when the memory information of "11" is written in the third reference cell Ref3 becomes larger than the third resistance value and smaller than the fourth resistance value.

Thus, the areas of the respective reference cells Ref1-Ref3 are so set that suitable resistance values can be given.

As described above, in the magnetoresistive effect elements MTJ11, MTJ12, MTJ21, MTJ22, MTJ31, MTJ32 used in the respective reference cells Ref1-Ref3, the magnetization fixed layer is positioned on the top, and the magnetization free layer is positioned on the bottom. Accordingly, the direction of the write current flowed in the respective reference cells Ref1-Ref3 when "11" is written in the reference cells Ref1-Ref3 and the direction of the read current flowed in the respective reference cells Ref1-Ref3 when memory information stored in the magnetic memory cells MC agree with each other. Accordingly, when memory information stored in the magnetic memory cell MC is read, the resistance states of the magnetoresistive effect elements MTJ11, MTJ12, MTJ21, MTJ22, MTJ31, MTJ32 are never rewritten. That is, when memory information stored in the magnetic memory cell MC is read, the resistance value of the reference cells Ref1-Ref3 are never changed.

As described above, the areas of the respective reference cells Ref1-Ref3 are set larger than the area of the magnetic memory cell MC. According to the present embodiment, it is not necessary to set the area of the reference cells Ref1-Ref3 smaller than the area of the magnetic memory cell MC, which allows the dimensions of the magnetic memory cell MC to be set at the minimum processing dimensions. The size of the magnetic memory cell MC can be set at dimensions approximate to the minimum processing dimensions, whereby the magnetic memory device can have a large capacity.

Figure 7:
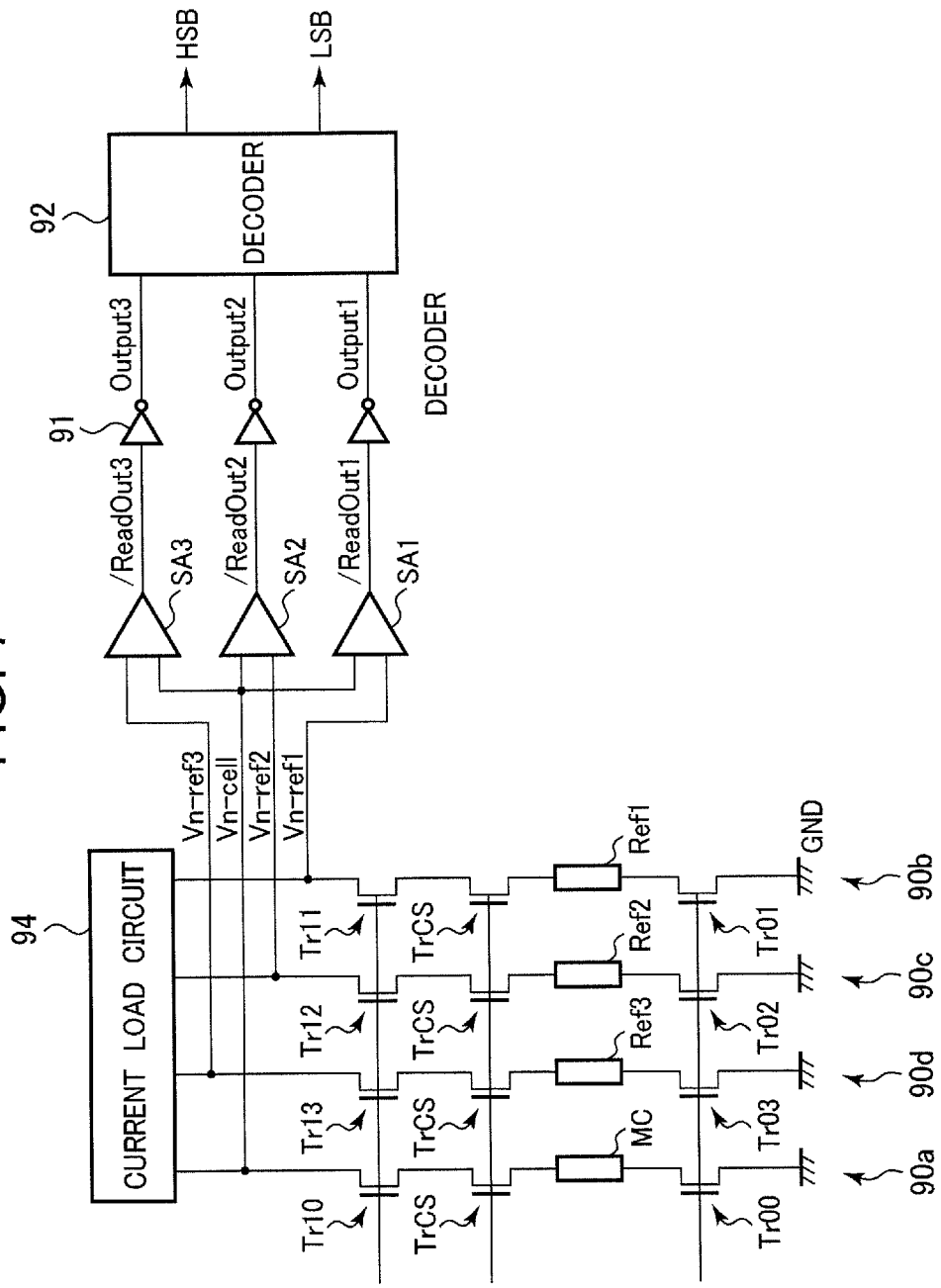
FIG. 7 is a diagrammatic view of a read circuit of the magnetic memory device according to the first embodiment.
Figure 8:
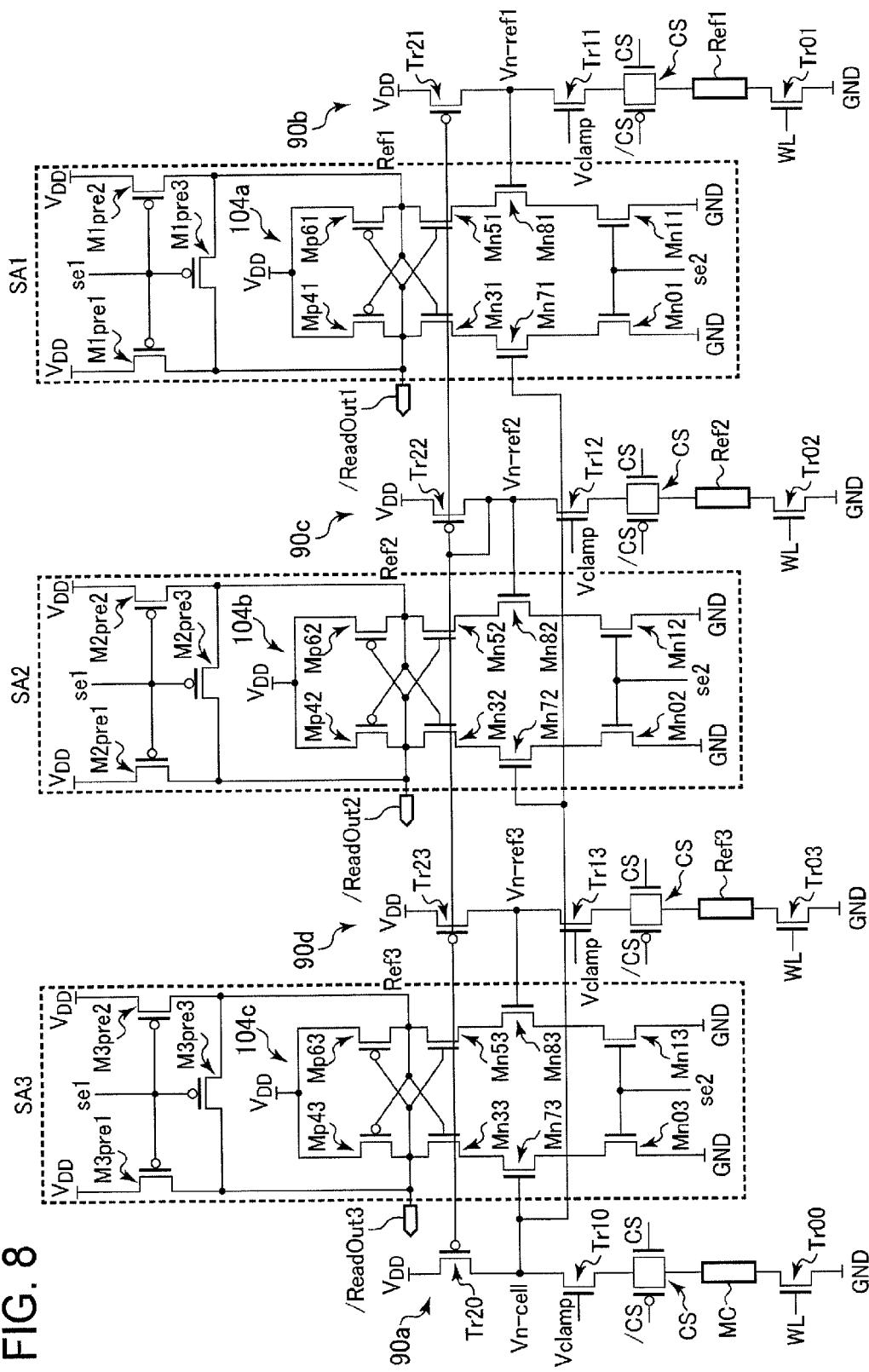
FIG. 8 is a circuit diagram of the read circuit of the magnetic memory device according to the first embodiment.

FIG. 7 is a diagrammatic view of the read circuit of the magnetic memory device according to the present embodiment. FIG. 8 is a circuit diagram of the read circuit of the magnetic memory device according to the present embodiment.

The read circuit includes current-voltage conversion circuits 90a-90d, differential amplification-type sense amplifiers (latching sense amplifiers, comparators) SA1-SA3, inverters 91, a decoder 92 and a current load circuit 94.

The current-voltage conversion circuit 90a flows a current to the magnetic memory cell MC and obtain a signal (voltage) corresponding to a resistance value of the magnetic memory cell MC.

The current-voltage conversion circuits 90b-90d respectively flow currents to the reference cells Ref1-Ref3 and respectively obtain the signals (voltages) corresponding to the resistance values of the reference cells Ref1-Ref3.

One ends of the magnetic memory cell MC and the reference cells Ref1-Ref3 can be electrically connected to the ground potential (GND) via the select transistors Tr00-Tr03.

The select transistors Tr00-Tr03 correspond to the select transistors 20 illustrated in FIG. 1.

The gates of the select transistors Tr00-Tr03 are connected to the word lines WL.

The other ends of the magnetic memory cell MC and the reference cells Ref1-Ref3 are connected to the current-voltage VDD via column selection switches CS, clamping NMOS transistors Tr10-Tr13 and load PMOS transistors Tr20-Tr23.

Into the column selection switches CS (see FIG. 8), column selection signals CS, /CS are inputted.

The TrCSs illustrated in FIG. 7 correspond to the transistors in the column selection switches CS illustrated in FIG. 8.

The clamping NMOS transistors Tr10-Tr13 are for retaining substantially constant the read voltages to be applied to the magnetic memory cell MC and the reference cells Ref1-Ref3. A bias voltage Vclamp is to be applied respectively to the gates of the clamping NMOS transistors Tr10-Tr13.

The load PMOS transistors Tr20-Tr23 (see FIG. 8) are used as current loads (load resistances). The sources of the load PMOS transistors Tr20-Tr23 are connected to the power supply voltage VDD. The load PMOS transistors Tr20-Tr23 connected to the power supply voltage VDD correspond to the current load circuits 94 illustrated in FIG. 7.

The potentials of the drains of the load PMOS transistors Tr20-Tr23, i.e., the potentials of the drains of the clamping NMOS transistors Tr10-Tr13 are to be output signals Vn-cell, Vn-ref1-Vn-ref3 of the current-voltage conversion circuit 90a.

The output signals Vn-cell, Vn-ref1-Vn-ref3 of the current-voltage conversion circuit 90a-90d are to be inputted respectively into the sense amplifiers SA1-SA3.

More specifically, the output signal Vn-cell of the current-voltage conversion circuit 90a is inputted into the gates of the respective NMOS transistors Mn71-Mn73 of the sense amplifiers SA1-SA3 (see FIG. 8).

The output signals Vn-ref1-Vn-ref3 of the current-voltage conversion circuits 90b-90d are inputted into the gates of the respective NMOS transistors Mn81-Mn83 of the respective sense amplifiers SA1-SA3.

To the gates of the respective load PMOS transistors Tr20-Tr23, the voltage of the drain of any one of the load PMOS transistors Tr20-Tr23 is applied. The drain of the load PMOS transistor Tr22 is electrically connected to the gates of the respective load PMOS transistors Tr20-Tr23 here. Thus, to the gates of the respective load PMOS transistors Tr20-Tr23, the same voltage as the potential of the drain of the load transistor Tr22 is applied. Thus, the current mirror-type sense amplifiers SA1-SA3 are formed.

Figure 9:
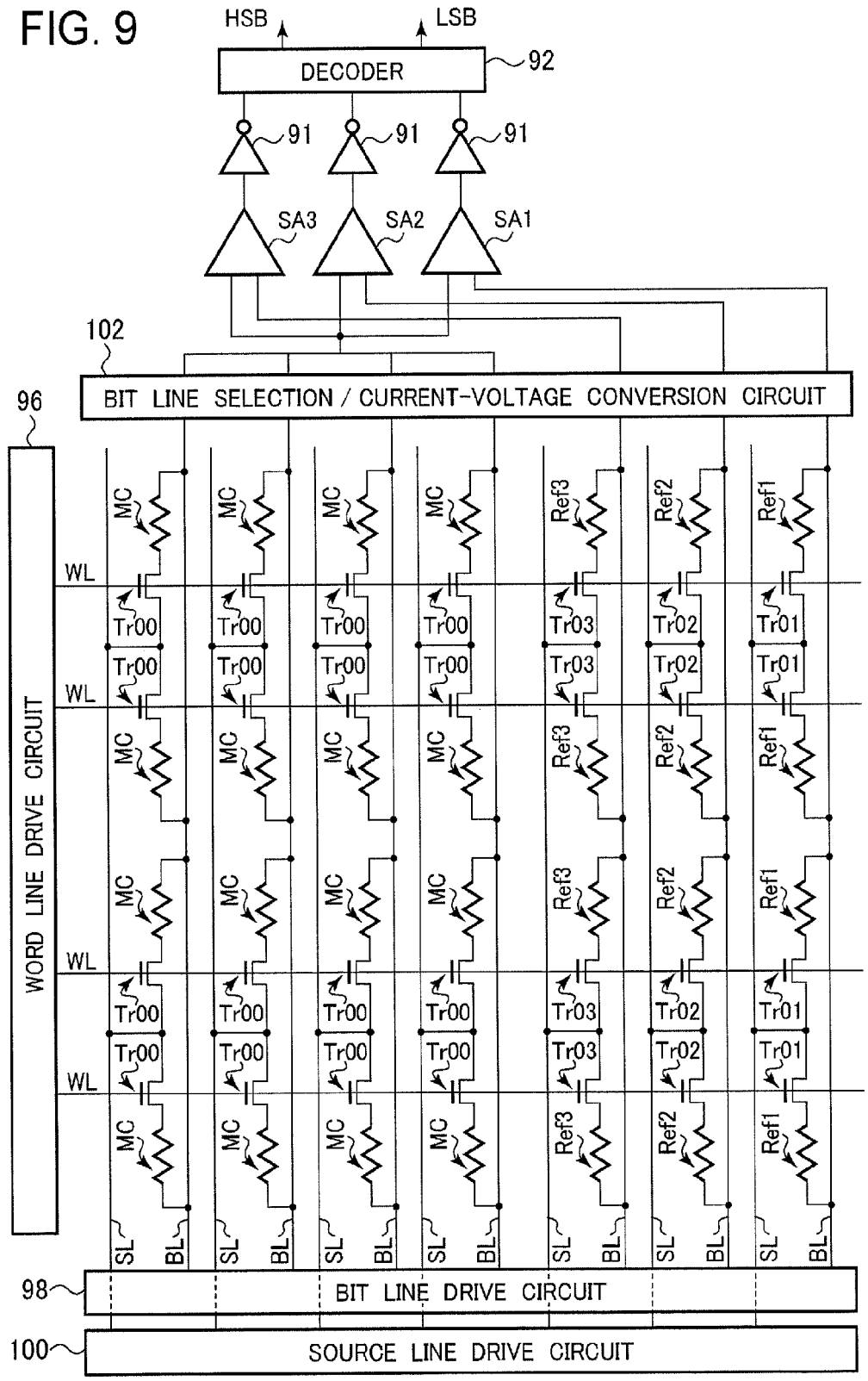
FIG. 9 is a circuit diagram of a memory cell array of the magnetic memory device according to the first embodiment.

FIG. 9 is the circuit diagram of the memory cell array of the magnetic memory device according to the present embodiment.

A plurality of the word lines WL are extended row-wise, i.e., left-to-right direction as viewed in FIG. 9.

A plurality of the bit lines BL and a plurality of the source lines SL are extended column-wise, i.e., up-to-down direction as viewed in FIG. 9.

At the intersections between the respective word lines WL and the respective bit lines BL, the select transistors Tr00-Tr03, the magnetic memory cells MC and the reference cells Ref1-Ref3 are respectively formed. The magnetic memory cells MC are laid out in a matrix. The reference cells Ref1-Ref3 are laid out respectively column-wise, i.e., up-to-down direction as viewed in FIG. 9.

A word line drive circuit 96 is connected to one ends of the word lines WL.

A bit line drive circuit 98 is connected to one ends of the bit lines BL. The bit line drive circuit 98 is used in writing in the magnetic memory cells MC and the reference cells Ref1-Ref3.

A source drive circuit 100 is connected to one ends of the source lines SL.

The other ends of the bit lines BL connected to the magnetic memory cells MC are connected to a bit line selection/current-voltage conversion circuit 102. The current-voltage conversion circuit 90a described above is formed in the bit line selection/current-voltage conversion circuit 102. More specifically, the column selection switches CS, the clamping NMOS transistors Tr10-Tr13 and the load PMOS transistors Tr20-Tr23 described above are formed in the bit line selection/current-voltage conversion circuit 102.

Outputs of the bit line selection/current-voltage conversion circuit 102 are connected to the sense amplifiers SA1-SA3. The sense amplifiers SA1-SA3 compares the voltage corresponding to the resistance of the selected magnetic memory cell MC and the voltages corresponding to the resistances of the reference cells Ref1-Ref3, respectively, and output the comparison results.

The outputs of the sense amplifiers SA1-SA3 are inputted into the inverters 91. The output signals of the sense amplifiers SA1-SA3 are inverted by an inverter 91 and are inputted into a decoder 92. The decoder 92 decodes the logical values of the inverted outputs of the sense amplifiers SA1-SA3 to output the memory information stored in a magnetic memory cell MC. In other words, the decoder 92 outputs a signal corresponding to the memory information stored in a selected magnetic memory cell MC, based on comparison results by the sense amplifiers SA1-SA3. The decoder 92 decodes in one step the memory information stored in a magnetic memory cell MC, based on the logical value of the output signals of the sense amplifiers SA1-SA3. Thus, according to the present embodiment, the information written in the magnetic memory cells MC can be quickly read.

Next, the operation of the magnetic memory device according to the present embodiment, and the reading method of the magnetic memory device according to the present embodiment will be described.

Figure 10:
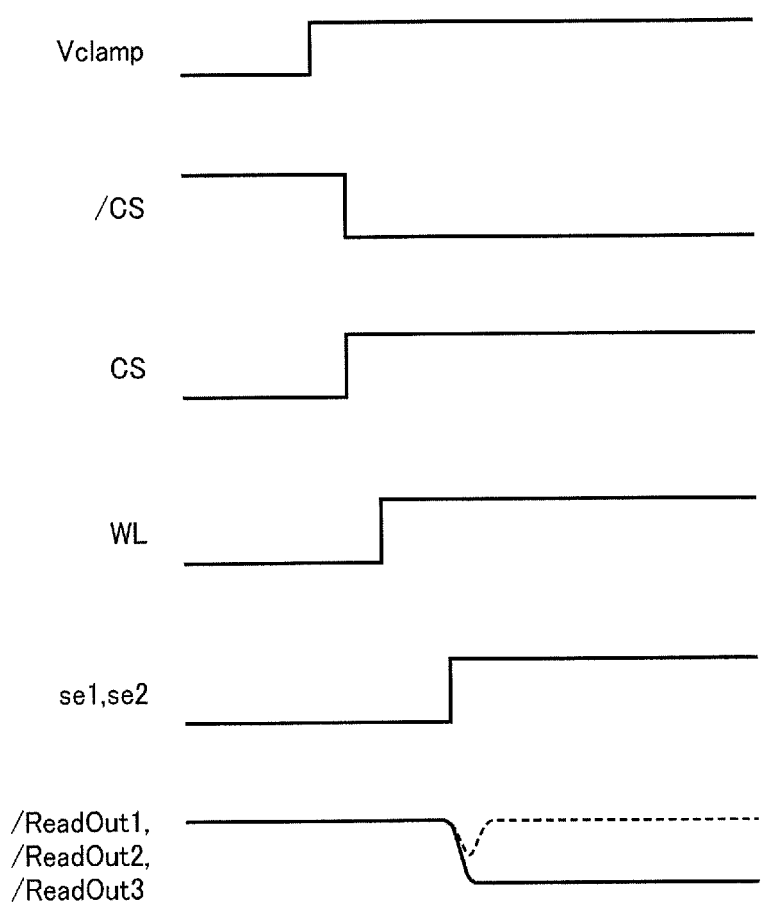
FIG. 10 is a time chart of a timing of a read operation of the read circuit of the magnetic memory device according to the first embodiment.

FIG. 10 is the time chart of the timing of the read operation of the read circuit of the magnetic memory device according to the present embodiment.

In FIG. 10, Vclamp indicates the bias voltage Vclamp to be applied to the gates of the claming transistors Tr10-Tr13. /CS, CS indicate the voltages to be applied to the column selection switches CS. WL indicates the voltage to be applied to the word lines WL.

sel indicates the voltage to be applied to the PMOS transistors M1pre1-M1pre3, M2pre1-M2pre3, M3pre1-M3pre3. se2 indicates the voltage to be applied to the NMOS transistors Mn01, Mn11, Mn02, Mn12, Mn03, Mn13.

/ReadOut1, /ReadOut2, /ReadOut3 indicate output signals of respective sense amplifiers SA1-SA3, respectively.

First, the initial state will be described.

In the initial state, the control terminals set of the PMOS transistors M1pre1-M1pre3, M2pre1-M2pre3, M3pre1-M3pre3 are set in the L (low) level.

The output signals /ReadOut1, /ReadOut2, /ReadOut3 of the sense amplifiers SA1-SA3 are the power supply voltage VDD.

The output voltages Vn-cell, Vn-ref1-Vn-ref3 of the current-voltage conversion circuits 90a-90b, i.e., the input voltages Vn-cell, Vn-ref1-Vn-ref3 of the sense amplifiers SA1-SA3 are the power supply voltage VDD.

The PMOS transistors Mp41, Mp42, Mp43, Mp61, Mp62, Mp63 of the latching circuit 104a-104c of the sense amplifiers SA1-SA3 are in the off-state.

Next, the stage of the precharge follows.

Upon the precharge, a prescribed bias voltage Vclamp is applied to the gates of the clamping NMOS transistors Tr10-Tr13.

Then, /CS voltage is set in the L level, and the voltage of CS is set in the H (high) level to thereby turn on the column selection switches CS.

Then, when the voltage to be applied to the word lines WL is set in the H level, the sense amplifiers SA1 SA3 of the read circuit start to be precharged.

In the present embodiment, the clamping NMOS transistors Tr10-Tr13 are used in the respective current-voltage conversion circuits 90a-90d. Accordingly, the voltages (read voltages) to be applied to a selected magnetic memory cell MC and the reference cells Ref1-Ref3 become voltages substantially equal to ((the bias voltage Vclamp)−(the threshold voltage of the clamping transistor)).

By the load PMOS transistors (current load) Tr20-Tr23, the currents (cell currents) flowing in the magnetic memory cell MC and the reference cells Ref1-Ref3 are converted to input voltages to be inputted into the sense amplifiers SA1-SA3. That is, differences (current differences) between a current flowing the magnetic memory cell MC and the currents flowing in the reference cells Ref1-Ref3 are amplified to large voltage differences by high load resistances given by the load PMOS transistors Tr20-Tr23.

At this time, the potentials of the control terminals se1 of the PMOS transistors M1pre1-M1pre3, M2pre1-M2pre3, M3pre1-M3pre3 are retained in the L level. Accordingly, the output signals /ReadOut1, /ReadOut2, /ReadOut3 of the sense amplifiers SA1-SA3 are retained at the power supply voltage VDD. Accordingly, the latching circuit 104a of the first sense amplifier formed by the transistors Mp31, Mp41, Mp51, Mp61 does not operate. The latching circuit 104b of the second sense amplifier formed by the transistors Mp32, Mp42, Mp52, Mp62 does not operate. The latching circuit 104c of the third sense amplifier formed by the transistors Mp33, Mp43, Mp53, Mp63 does not operate.

Next, the stage of the amplification will be described.

Upon the amplification, the potentials of the control terminals se1 of the PMOS transistors M1pre1-M1pre3, M2pre1-M2pre3, M3pre1-M3pre3 are changed to the H level.

The potentials of the control terminals se2 of the NMOS transistors Mn01, Mn11, Mn02, Mn12, Mn03, Mn13 are also changed to the H level.

Then, the PMOPS transistors M1pre1-M1pre3, M2pre1-M2pre3, M3pre1-M3pre3 are turned off.

On the other hand, the NMOS transistors Mn01, Mn11, Mn02, Mn12, Mn03, Mn13 are turned on.

Then, currents start to flow via the transistors M71-M73, M81-M83, and the potentials of the output terminals /ReadOut1-/ReadOut3, Ref1-Ref3 gradually lower. The currents flowing in the transistors M71-M73, M81-M83 become the currents correspond to voltages Vn-cell, Vn-ref1-Vn-ref3 to be applied to the gates of the transistors M71-M73, M81-M83.

In the sense amplifier SA1, because of the voltages Vn-cell, Vn-ref1 applied to the gates of the transistors M71, M81 being different from each other, the values of the currents flowing in the transistors M71, M81 become different from each other, and the discharge advances at speeds different from each other.

At the potentials of the output terminals /ReadOut1, Ref1 which become around lower the threshold voltage of the transistors Mp41, Mp61 than the power supply voltage VDD, the amplification due to the positive feedback of the latching circuit 104a starts, and the outputs are decided.

That is, when a resistance value of a selected magnetic memory cell MC is larger than the resistance value of the reference cell Ref 1, the voltage Vn-cell applied to the gate of the transistor M71 becomes higher than the voltage Vn-ref1 applied to the gate of the transistor Mn81. In this case, the potential of the drain of the transistor M71 becomes lower than the potential of the drain of the transistor M81, and finally, the potential of the output terminal /ReadOut1 becomes the L level, and the potential of the terminal Ref1 becomes the H level.

On the other hand, a resistance value of the selected magnetic memory cell MC is smaller than the resistance value of the reference cell Ref1, the voltage Vn-cell applied to the gate of the transistor M71 becomes lower than the voltage Vn-ref1 applied to the gate of the transistor Mn81. In this case, the potential of the drain of the transistor M71 becomes higher than the potential of the drain of the transistor M81, and finally, the potential of the output terminal /ReadOut1 becomes the H level, and the potential of the terminal Ref1 becomes the L level.

In the sense amplifier SA2, the potentials Vn-cell, Vn-ref2 applied to the gates of the transistors M72, M82 are different from each other, and accordingly the values of the currents flowing in the transistors M72, M82 become different from each other, and the discharge advances at speeds different from each other.

At the potentials of the output terminals /ReadOut2, Ref2 which become around lower the threshold voltage of the transistors Mp42, Mp62 than the power supply voltage VDD, the amplification due to the positive feedback of the latching circuit 104b starts, and the outputs are decided.

That is, when a resistance value of a selected magnetic memory cell MC is larger than the resistance value of the reference cell Ref2, the voltage Vn-cel2 applied to the gate of the transistor M72 becomes higher than the voltage Vn-ref2 applied to the gate of the transistor Mn82. In this case, the potential of the drain of the transistor M72 becomes lower than the potential of the transistor M82, and finally, the potential of the output terminal /ReadOut2 becomes the L level, and the potential of the terminal Ref2 becomes the H level.

On the other hand, when a resistance value of the selected magnetic memory cell MC is smaller than the resistance value of the reference cell Ref2, the voltage Vn-cel2 applied to the gate of the transistor M72 becomes lower than the voltage Vn-ref2 applied to the gate of the transistor Mn82. In this case, the potential of the drain of the transistor M72 becomes lower than the potential of the drain of the transistor M82, and finally, the potential of the output terminal /ReadOut2 becomes the H level, and the potential of the terminal Ref2 become the L level.

In the sense amplifier SA3, the voltages Vn-cell, Vn-ref3 applied to the gates of the transistors M73, M83 are different from each other, and accordingly, the values of the currents flowing in the transistors M73, 83 are different from each other, and the discharge advances at speeds different from each other.

At the potentials of the output terminals /ReadOut3, Ref3 which become around lower the threshold voltage of the transistors Mp43, Mp63 than the power supply voltage VDD, the amplification due to the positive feedback of the latching circuit 104c starts, and the outputs are decided.

That is, when a resistance value of a selected magnetic memory cell MC is larger than the resistance value of the reference cell Ref3, the voltages Vn-cel3 applied to the gate of the transistor M73 becomes higher than the voltage Vn-ref3 applied to the gate of the transistor Mn83. In this case, the potential of the drain of the transistor M73 becomes lower than the potential of the drain of the transistor M83, and finally, the potential of the output terminal /ReadOut3 becomes the L level, and the potential of the terminal Ref3 becomes the H level.

On the other hand, when a resistance value of the selected magnetic memory cell MC is lower than the resistance value of the reference cell Ref3, the voltage Vn-cel3 applied to the gate of the transistor M73 becomes lower than the voltage Vn-ref3 applied to the gate of the transistor Mn83. In this case, the potential of the drain of the transistor M73 becomes higher than the potential of the drain of the transistor M83, and finally, the potential of the output terminal /ReadOut3 becomes the H level, and the potential of the terminal Ref3 becomes the L level.

When the memory information stored in a selected magnetic memory cell MC is "00", both the magnetoresistive effect elements MTJ01 and the magnetoresistive effect elements MTJ02 are in the low resistance state. In this case, the resistance value of the selected magnetic memory cell MC becomes lower than the resistance values of the reference cells Ref1-Ref3. The sense amplifiers SA1-SA3 output signals of the H levels when the voltage corresponding to the resistance value of the selected magnetic memory cell MC is lower than the voltages corresponding to the resistance values of the reference cells Ref1-Ref3. On the other hand, when the voltage corresponding to the resistance value of the selected magnetic memory cell MC is higher than the voltages corresponding to the resistance values of the reference cells Ref1-Ref3, the sense amplifiers SA1-SA3 output signals of the L level. Accordingly, the resistance value of the selected magnetic memory cell MC is smaller than the resistance values of all the reference cells Ref1-Ref3, the output signals /ReadOut1-ReadOut3 of all the sense amplifiers SA1-SA3 becomes the H level.

The output signals of the H level from the sense amplifiers SA1-SA3 are inverted by the inverters 91. Thus, the output signals Output1-Output3 of the inverters 91, i.e., the input signals into the decoder 92 all becomes the L level.

FIG. 11 is a view illustrating the relationships between the input and output of the decoder.

As illustrated in FIG. 11, when the output signals Output1-Output3 of the inverters 91, i.e., the input signals into the decoder 92 are all the L level, the decoder 92 outputs data of "00". That is, the upper bit (MSB: Most Significant Bit) of the decoder 92 becomes the L level, and the lower bit (LSB: Least Significant Bit) of the decoder 92 becomes the L level.

When the memory information stored in the selected magnetic memory cell MC is "01", the magnetoresistive effect elements MTJ01 are in the high resistance state, and the magnetoresistive effect elements MTJ02 are in the low resistance state. In this case, the resistance value of the selected magnetic memory cell MC becomes larger than the resistance value of the reference cell Ref1 and becomes smaller than the resistance values of the reference cells Ref2 and Ref3. Accordingly, the output signal /ReadOut1 of the sense amplifier SA1 becomes the L level, and the output signals /ReadOut2, /ReadOut3 of the sense amplifiers SA2 and the sense amplifier SA3 become the H level. The output signals /ReadOut1-/ReadOut3 from the sense amplifiers SA1-SA3 are inverted by the inverters 91. Thus, the output signal Output1 from the inverter 91 becomes the H level, and the output signal Output2, Output3 from the inverters 91 become the L level.

Then, as illustrated in FIG. 11, when the output signal Output1 is the H level, and the output signals Output2, Output3 are the L level, the decoder 92 outputs the data of "01". That is, the output of the upper bit MSB from the decoder 92 becomes the L level, and the lower bit LSB from the decoder 92 becomes the H level.

When the memory information stored in the selected magnetic memory cell MC is "10", the magnetoresistive effect element MTJ01 is in the low resistance state, and the magnetoresistive effect element MTJ02 is in the high resistance state. In this case, the resistance value of the selected magnetic memory cell MC becomes larger than the resistance values of the reference cell Ref1 and the reference cell Ref2 and is smaller than the resistance value of the reference cell Ref3. The outputs of the sense amplifiers SA1 and the sense amplifier SA2 become the L level, and the output of the sense amplifier SA3 becomes the H level. The output signals /ReadOut1-/ReadOut3 from the sense amplifiers SA1-SA3 are inverted by the inverters 92. Thus, the output signals Output1, Output2 from the inverters 92 become the H level, and the output signal Output3 from the inverter 92 becomes the L level.

As illustrated in FIG. 11, when the output signals Output1, Output2 are the H level, and the output signal Output3 is the L level, the decoder 92 outputs the data of "10". That is, the output of the upper bit MSB of the decoder 92 is the H level, and the output of the lower bit LSB of the decoder 92 is the L level.

When the memory information stored in the selected magnetic memory cell MC is "11", the magnetoresistive effect element MTJ01 and the magnetoresistive effect element MTJ02 are all in the high resistance state. In this case, the resistance value of the selected magnetic memory cell MC becomes larger than the resistance values of all the reference cells Ref1-Ref3. Then, the outputs of the sense amplifiers SA1-SA3 become the L level. Outputs from the sense amplifiers SA1-SA3 are inverted by the inverters 92. The output signals Output1-Output3 from the inverters 92 all become the H level.

As illustrated in FIG. 11, when all the output signals Output1-Output3 are the H level, the decoder 92 outputs the data of "11". That is, the output of the upper bit MSB of the decoder 92 becomes the H level, and the lower bit LSB of the decoder 92 also becomes the H level.

Figure 12:
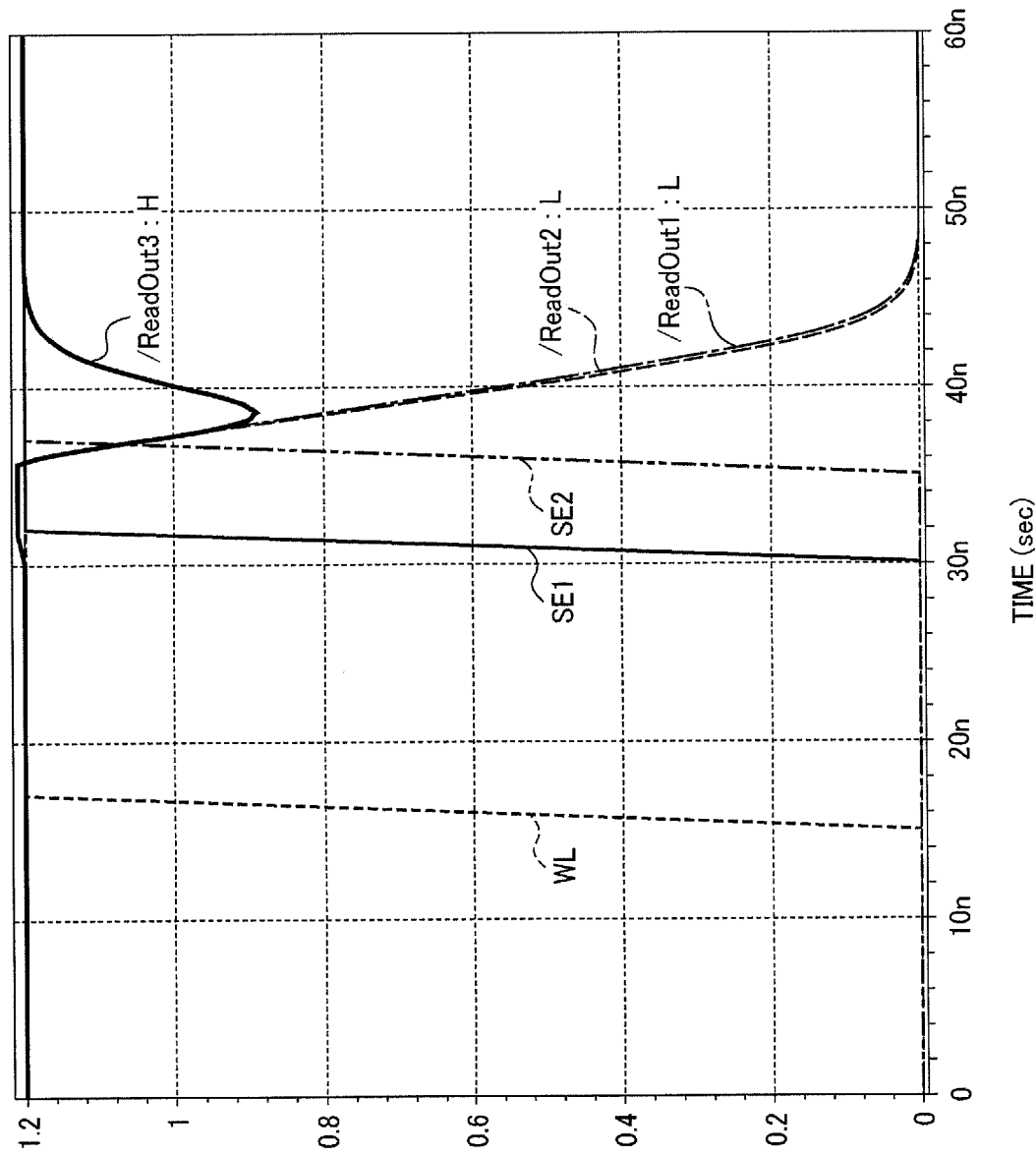
FIG. 12 is a view of a simulation result of the read circuit of the magnetic memory device according to the first embodiment.

FIG. 12 is a view of a simulation result of the read circuit of the magnetic memory device according to the present embodiment.

FIG. 12 illustrates the case that the memory information written in a selected memory cell MC is "10".

As seen in FIG. 12, when the information written in the memory cell MC is "10", the output signals /ReadOut1, /ReadOut2 from the sense amplifiers SA1, SA2 become the L level. The output signal /ReadOut3 from the sense amplifier SA3 becomes the H level.

Next, the method of manufacturing the magnetic memory device according to the present embodiment will be described with reference to FIGS. 13A to 18. FIGS. 13A to 18 are sectional views of the magnetic memory device according to the present embodiment in the steps of the method of manufacturing the magnetic memory cell, which illustrate the method.

Figure 13A:
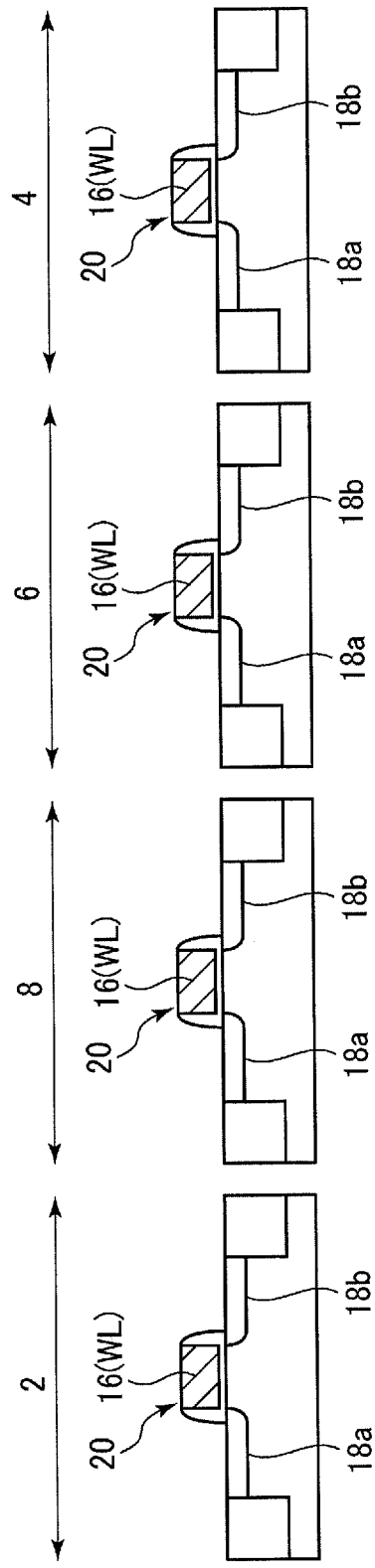

As illustrated in FIG. 13A, the device isolation regions 12 for defining the device regions are formed in the semiconductor substrate 10 by, e.g., STI (Shallow Trench Isolation). As the semiconductor substrate 10, a silicon substrate, for example, is used.

Next, in the same way as in the ordinary MOS transistor manufacturing method, the select transistors each including the gate electrode 16 and the source/drain diffused layers 18a, 18b are formed.

Figure 13B:
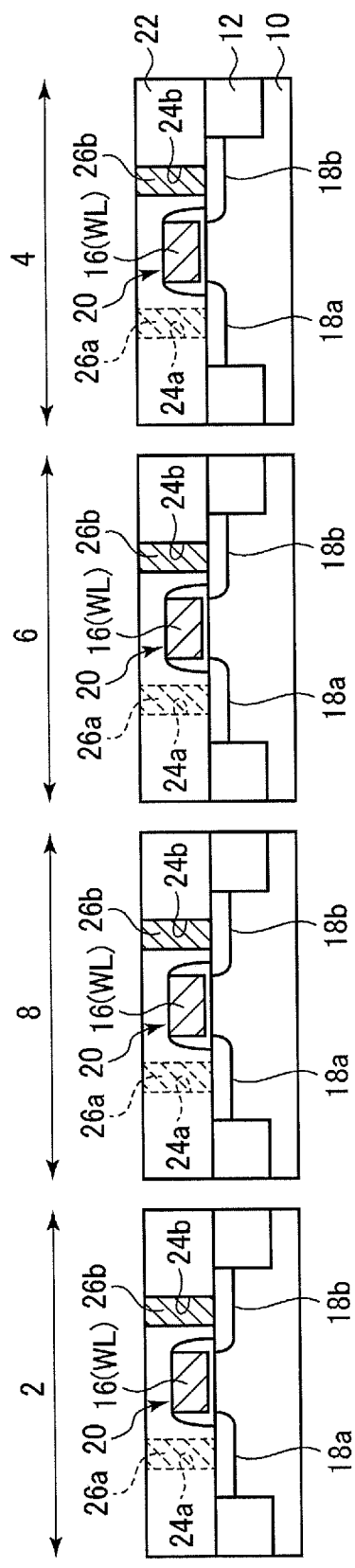

Then, as illustrated in FIG. 13B, the inter-layer insulation film 22 of, e.g., silicon oxide film is formed on the entire surface by, e.g., CVD (Chemical Vapor Deposition).

Next, by photolithography, the contact holes 24a, 24b are formed down to the source/drain diffused layers 18a, 18b of the select transistors 20.

Next, a barrier metal film is formed by, e.g., sputtering.

Next, a tungsten film is formed by, e.g., CVD.

Then, the tungsten film and the barrier metal film are polished by, e.g., CMP (Chemical Mechanical Polishing) until the surface of the inter-layer insulation film 22 is exposed.

Thus, the conductor plugs 26a, 26b of tungsten are buried in the contact holes 24a, 24b.

Then, a conduction film is formed by, e.g., sputtering.

Then, the conduction film is patterned by photolithography. Thus, the source lines 28 are formed, electrically connected to the source diffused layers 18a of the select transistors 40 via the conductor plugs 26a. The relay interconnections 30 are formed, electrically connected to the drain diffused layers 18b of the transistors 40 via the conductor plugs 26b (FIG. 14A).

Next, the inter-layer insulation film 32 of, e.g., silicon oxide film is formed on the entire surface by, e.g., CVD.

Next, by photolithography, the contact holes 34 are formed in the inter-layer insulation film 32 down to the relay interconnections 30.

Next, a barrier metal film is formed by, e.g., sputtering.

Then, a tungsten film is formed by, e.g., CVD.

Next, the tungsten film and the barrier metal film are polished by, e.g., CMP until the surface of the interlayer insulation film 32 is exposed.

Thus, in the contact holes 34, the conductor plugs 36 of tungsten are buried (FIG. 14B).

Next, the about 5 nm-film thickness tantalum film 40 (see FIG. 2), for example, is formed on the entire surface by, e.g., sputtering.

Then, the about 25 nm-film thickness ruthenium film 42 (see FIG. 2), for example, is formed on the entire surface by, e.g., sputtering.

Next, the about 15 nm-film thickness Ta film 44 (see FIG. 2), for example, is formed on the entire surface by, e.g., sputtering.

The Ta film 40, the Ru film 42 and the Ta film 44 form the layer film 38 (FIG. 15A). The layer film 38 is to be the lower electrodes 38 of the magnetic memory cell MC and the reference cells Ref1-Ref3.

Then, the buffer layer 46 (see FIG. 2) of, e.g., the 8 nm-film thickness Ru film is formed on the entire surface by, e.g., sputtering.

Next, the ferromagnetic layer 48 of, e.g., the about 1.5 nm-film thickness CoFeB film is formed on the entire surface by, e.g., sputtering. The ferromagnetic layer 48 is to be the magnetization free layer.

Next, the tunnel barrier layer (tunnel insulation film) 50 of, e.g., the about 1 nm-film thickness MgO film is formed on the entire surface by, e.g., sputtering.

Next, the about 2.5 nm-film thickness CoFeB film (see FIG. 2), for example, is formed on the entire surface by, e.g., sputtering.

Then, the about 1 nm-film thickness Ru film 56 (see FIG. 2), for example, is formed on the entire surface by, e.g., sputtering.

Next, the about 2.6 nm-film thickness CoFe film (see FIG. 2), for example, is formed on the entire surface by, e.g., sputtering.

Next, the about 8 nm-film thickness IrMn film 60 (see FIG. 2), for example, is formed on the entire surface by, e.g., sputtering.

Thus, the layer film 52 of the CoFeB film 54, the Ru film 56, the CoFe film 58 and the IrMn film 60 is formed. The layer film 52 is to be the magnetization fixed layer.

Next, the intermediate layer 62 of, e.g., the about 5 nm-film thickness Ru film is formed on the entire surface by, e.g., sputtering.

Next, the ferromagnetic layer 64 of, e.g., the about 1.5 nm-film thickness CoFeB film is formed on the entire surface by, e.g., sputtering. The ferromagnetic layer 64 is to be the magnetization free layer.

Next, the tunnel barrier layer 66 of, e.g., the about 1 nm-film thickness MgO film is formed on the entire surface by, e.g., sputtering.

Next, the about 2.5 nm-film thickness CoFeB film (see FIG. 2), for example, is formed on the entire surface by, e.g., sputtering.

Next, the about 1 nm-film thickness Ru film 72 (see FIG. 2), for example, is formed on the entire surface by, e.g., sputtering.

Then, the about 2.6 nm-film thickness CoFe film (see FIG. 2), for example, is formed on the entire surface by, e.g., sputtering.

Next, the about 8 nm-film thickness IrMn film 76 (see FIG. 2), for example, is formed on the entire surface by, e.g., sputtering.

Thus, the layer film 68 of the CoFeB film 70, the Ru film 72, the CoFe film 74 and the IrMn film 76 is formed. The layer film 68 is to be the magnetization fixed layer.

Next, the cap layer 78 (see FIG. 2) of, e.g., the about 7 nm-film thickness Ru film, for example, is formed on the entire surface by, e.g., sputtering.

Then, the about 40 nm-film thickness Ta film 80, for example, is formed on the entire surface by, e.g., sputtering. The Ta film 80 is to be the upper electrodes 80 of the magnetic memory cell MC and the reference cells Ref1-Ref3.

Then, a photoresist film is formed on the entire surface by, e.g., spin coating.

Then, by photolithography, the photoresist film is patterned into plane shapes of the magnetoresistive effect elements MTJ02, MTJ12, MTJ22, MTJ32. Thus, the patterns 106a-106d of the photoresist film are formed. The sizes of the patterns 106a-106d of the photoresist film are so set that required areas of the magnetoresistive effect elements MTJ02, MTJ12, MTJ22, MTJ32 can be given (FIG. 15B).

Then, with the photoresist film 106a-106d as the mask, the Ta film 80, the cap layer 78, the layer film 68, the tunnel barrier layer 66 and the ferromagnetic layer 64 are etched. Thus, the magnetoresistive effect elements MTJ02, MTJ12, MTJ22, MTJ32 including the magnetization free layer 64, the tunnel barrier layer 66 and the magnetization fixed layer 68 are formed. On the magnetoresistive effect elements MTJ02, MTJ12, MTJ22, MTJ32, the upper electrodes 80, of, e.g., Ta film are formed (FIG. 16A).

Next, a silicon oxide film is formed on the entire surface by, e.g., CVD.

Then, the silicon oxide film is anisotropically etched. Thus, the spacers 108 are formed on the side walls of the magnetoresistive effect elements MTJ02, MTJ12, MTJ22, MTJ32.

Then, with the upper electrodes 80 and the spacers 108 as the mask, the intermediate layer 62, the layer film 52, the tunnel barrier layer 50 and the ferromagnetic layer 48 are etched. Thus, the magnetoresistive elements MTJ01, MTJ11, MTJ21, MTJ31 including the magnetization free layer 48, the tunnel barrier layer 50 and the magnetization fixed layer 52 are formed (FIG. 16B).

Next, by photolithography, the layer film 38 is patterned. Thus, the lower electrodes 38 of the memory cell MC and the reference cells Ref1-Ref3 are formed of the layer film (FIG. 17A).

Next, the inter-layer insulation film 32 of silicon oxide film is formed on the entire surface by, e.g., CVD.

Next, the inter-layer insulation film 32 is polished by, e.g., CMP until the upper surface of the upper electrodes 80 are exposed (FIG. 17B).

Next, the conduction film is formed on the entire surface by, e.g., sputtering.

Next, the conduction film is patterned by photolithography. Thus, the bit line 84 of the conduction film is formed.

Figure 18:
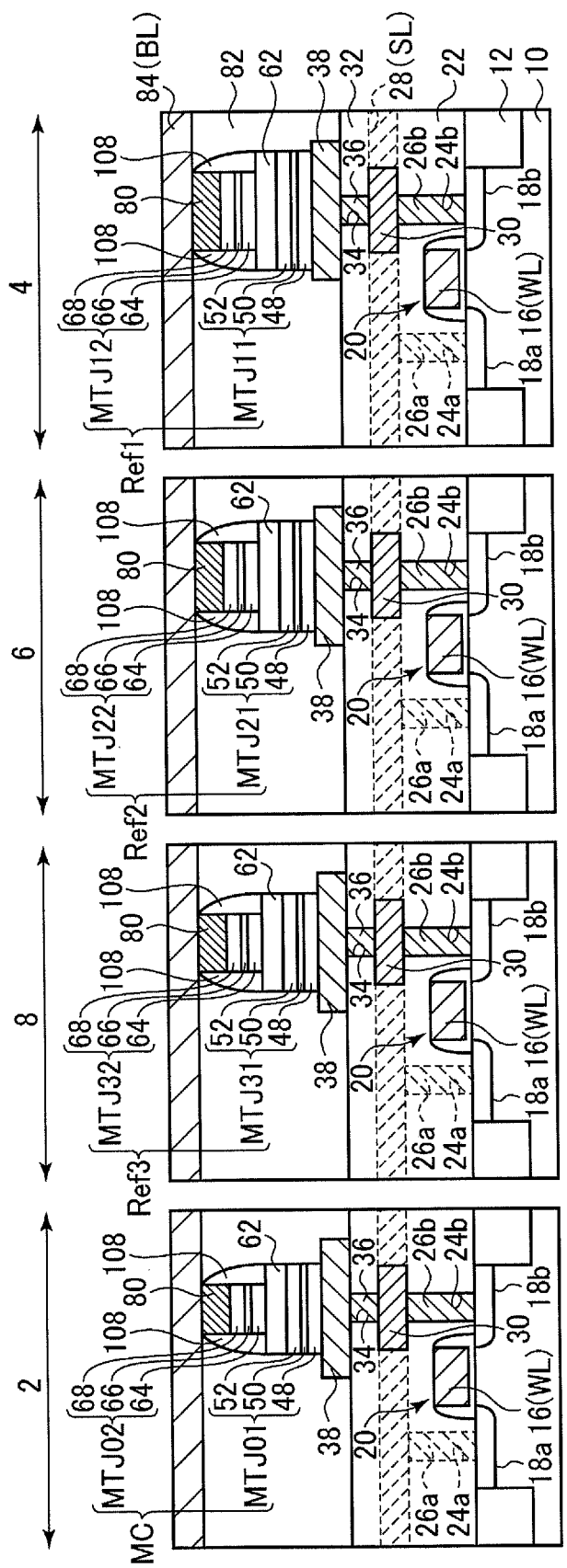

Thus, the magnetic memory device according to the present embodiment is manufactured (FIG. 18).

As described above, according to the present embodiment, the reference cells Ref1-Ref3 are provided. The resistance value of the reference cell Ref1 is set larger than the resistance value given when "00" is written in the magnetic memory cell MC and smaller than the resistance value given when "01" is written in the magnetic memory cell MC. The resistance value of the reference cell Ref2 is set larger than the resistance value given when "01" is written in the magnetic memory cell MC and smaller than the resistance value given when "10" is written in the magnetic memory cell MC. The resistance value of the reference cell Ref3 is set larger than the resistance value given when "10" is written in the magnetic cell MC and smaller than the resistance value given when "11" is written in the magnetic memory cell MC. The comparator SA1, which compares the signal corresponding to the electric resistance of the magnetic memory cell MC and the signal corresponding to the electric resistance of the reference cell Ref1 with each other, is provided. The comparator SA2, which compares the signal corresponding to the electric resistance of the magnetic memory cell MC and the signal corresponding to the electric resistance of the reference cell Ref2 with each other is provided. The comparator SA3, which compares the signal corresponding to the electric resistance of the magnetic memory cell MC and the signal corresponding to the electric resistance of the reference cell Ref3 with each other, is provided. Based on the logic value of outputs of the comparators SA1-SA3, information written in the magnetic memory cell MC is decoded by the decoder 92 in one step. Thus, the present embodiment can provide a magnetic memory device which can speedily read multivalued memory information written in the magnetic memory cells MC.

[b] A Second Embodiment

The magnetic memory device according to a second embodiment and its reading method will be described with reference to FIG. 19. FIG. 19 is the circuit diagram of the magnetic memory device according to the present embodiment. The same members of the present embodiment as those of the magnetic memory device according to the first embodiment and its reading method illustrated in FIGS. 1 to 18 are represented by the same reference numbers not to repeat or to simplify the description.

In the magnetic memory device according to the present embodiment, a plurality of the reference cells Ref1-Ref3 are provided for the respective ones of a plurality of blocks 110a, 110b. When the memory information written in the magnetic memory cells MC of the block 110a, the reference cells Ref1-Ref3 formed in the block 110b are used. The memory information written in the magnetic memory cells MC of the block 110b is read, the reference cells Ref1-Ref3 formed in the block 110a are used.

In the respective blocks 110a, 110b, a plurality of the word lines WL are extended row-wise, i.e., left-to-right as viewed in FIG. 19.

In the respective blocks 110a, 110b, a plurality of the bit lines BL and a plurality of the source lines SL are extended column-wise, i.e., up-to-down as viewed in FIG. 19.

At the respective intersections between the word lines WL and bit lines BL, the select transistors Tr00-Tr03, the magnetic memory cells MC and the reference cells Ref1-Ref3 are provided. A plurality of the magnetic memory cells MC are laid out in a matrix. The plural reference cells Ref1-Ref3 are laid out row-wise, i.e., left-to-right as viewed in FIG. 19. The reference cells Ref1-Ref3 are provided, i.e., four for the respective blocks 110a, 110b.

Due to manufacturing variability, etc. it is often difficult that the reference cells Ref1-Ref3 have required resistance values. According to the present embodiment, a plurality of the reference cells Ref1-Ref3 are formed, and those of the plural reference cells Ref1-Ref3, which have suitable resistance values may be selected. For example, plural reference cells Ref1-Ref3 whose sizes are a little different from each other are formed, and reference cells Ref1-Ref3 of suitable resistance values can be selected from such plural reference cells Ref1-Ref3.

To one ends of the word lines WL formed in the block 110a, a word line drive circuit 96a is connected. A word line drive circuit 96b is connected to one ends of the word lines WL formed in the block 110b.

To one ends of the bit lines BL formed in the block 110a, a bit line drive circuit 98a is connected. A bit line drive circuit 98b is connected to one ends of the bit lines BL formed in the block 110b.

To one ends of the source lines SL formed in the block 110a, a source line drive circuit 100a is connected. A source line drive circuit 100b is connected to one ends of the source lines SL formed in the block 110b.

The other ends of the bit lines BL connected to the magnetic memory cells MC in the block 110a are connected to a bit line selection/current-voltage conversion circuit 102a. The other ends of the bit lines BL connected to the magnetic memory cells MC in the block 110b are connected to a bit line selection/current-voltage conversion circuit 102b.

The column selection switches CS, the clamping NMOS transistors Tr10-Tr13 and the load PMOS transistors Tr20-Tr23 are formed respectively in the bit line selection/current-voltage conversion circuits 102a, 102b.

When the memory information in the magnetic memory cells MC in the block 110a is read, an output signal Vn-cell (see FIG. 8) corresponding to a resistance value of a selected magnetic memory cell MC is inputted to the sense amplifiers SA1a-SA3a via bit line selection/current-voltage conversion circuit 102a. The output signals corresponding to the resistance values of the reference cells Ref1-Ref3 are inputted to the sense amplifiers SA1a-SA3a via the bit line selection/current-voltage conversion circuit 102b. That is, when memory information in the magnetic memory cells MC in the block 110a is read, the reference cells Ref1-Ref3 in the block 110b are used for the comparison.

When the memory information in the magnetic memory cells MC in the block 110a, the bit line selection/current-voltage conversion circuit 102b selects for use a reference cell Ref1 of a suitable resistance value out of the plural reference cells Ref1 formed in the block 110b. The bit line selection/current voltage conversion circuit 102b selects for use a reference cell Ref2 of a suitable resistance value out of the plural reference cells Ref2 formed in the block 110b. The bit line/current-voltage conversion circuit 102b selects for use a reference cell Ref3 of a suitable resistance value out of the plural reference cells Ref3 formed in the block 110b.

The sense amplifier SA1a compares the output signal Vn-cell corresponding to the resistance value of the selected magnetic memory cell MC in the block 110a and the output signal Vn-ref1 corresponding to the resistance value of the selected reference cell Ref1 in the block 110b with each other. The sense amplifier SA2a compares the output signal Vn-cell corresponding to the resistance value of the selected magnetic memory cell MC in the block 110a and the output signal Vn-ref2 corresponding to the resistance value of the selected reference cell Ref2 in the block 110b with each other. The sense amplifier SA3a compares the output signal Vn-cell corresponding to the resistance value of the selected magnetic memory cell MC in the block 110*a* and the output signal Vn-ref3 corresponding to the resistance value of the selected reference cell Ref3 in the block 110*b* with each other.

The outputs of the sense amplifiers SA1*a*-SA3*a* are inverted by the inverters 91 and inputted into the decoder 92*a*. Based on the inverted outputs of the sense amplifiers SA1*a*-SA3*a*, the decoder 92*a* decodes the memory information stored in the selected magnetic memory cell MC.

When the memory information in the magnetic memory cells MC in the block 110*b* is read, the output signal Vn-cell of the current-voltage conversion circuit 90*a* (see FIG. 7) in the block 110*b* is inputted into the sense amplifiers SA1*b*-SA3*b*. The current-voltage conversion circuit 90*a* in the block 110*b* outputs the output signal Vn-cell corresponding to a resistance value of a selected magnetic memory cell MC in the block 110*b*. The current-voltage conversion circuit 90*a* in the block 110*b* is provided in the bit line selection/current-voltage conversion circuit 102*b* in FIG. 19.

When the memory information in the magnetic memory cells in the block 110*b* is read, the output signal Vn-cell (see FIG. 8) corresponding to a resistance value of a selected magnetic memory cell is inputted to the sense amplifiers SA1*b*-SA3*b* via the bit line selection/current-voltage conversion circuit 102*b*. The output signals Vn-ref1-Vn-ref 3 corresponding to the resistance values of the reference cells Ref1-Ref3 are inputted respectively into the sense amplifiers SA1*b*-SA3*b* via the bit line selection/current-voltage conversion circuit 102*a*. That is, when the memory information in the magnetic memory cells in the block 110*b* is read, the comparison is made by using the reference cells Ref1-Ref3 in the block 110*a*.

When the memory information in the magnetic memory cells in the block 110*b* is read, the bit line selection/current-voltage conversion circuit 102*a* selects for use a reference cell Ref1 of a suitable resistance value out of the plural reference cells Ref1 formed in the block 110*b*. The bit line selection/current-voltage conversion circuit 102*a* selects for use a reference cell Ref2 of a suitable resistance value out of the plural reference cells Ref2 formed in the block 110*b*. The bit line selection/current-voltage conversion circuit 102*a* selects for use a reference cell Ref3 of a suitable resistance value out of the plural reference cells Ref3 formed in the block 110*b*.

The sense amplifier SA1*b* compares the output signal Vn-cell corresponding to a resistance value of the selected magnetic memory cell MC in the block 110*b* and the output signal Vn-ref1 corresponding to the resistance value of the reference cell Ref1 selected in the block 110*a* with each other. The sense amplifier SA2*b* compares for use the output signal Vn-cell corresponding to the resistance value of the magnetic memory cell MC selected in the block 110*b* and the output signal Vn-ref2 corresponding to the resistance value of the reference cell Ref2 selected in the block 110*a* with each other. The sense amplifier SA3*b* compares the output signal Vn-cell corresponding to the resistance value of the magnetic memory cell MC selected in the block 110*b* and the output signal Vn-ref3 corresponding to the resistance value of the reference cell Ref3 selected in the block 110*a* with each other.

The outputs of the sense amplifiers SA1*a*-SA3*b* are inverted by the inverters 91 and inputted into the decoder 92*b*. Based on the inverted outputs of the sense amplifiers SA1*b*-SA3*b*, the decoder 92*b* decodes the memory information stored in the selected magnetic memory cell MC.

As described above, according to the present embodiment, the plural reference sells Ref1-Ref3 are provided in the plural blocks 110*a*, 110*b*, respectively. When the memory information written in the magnetic memory cells MC of the block 110*a* is read, the reference cells Ref1-Ref3 formed in the block 110*b* are used for the comparison. When the memory information written in the magnetic memory cells MC of the block 110*b* is read, the reference cells Ref1-Ref3 formed in the block 110*a* are used for the comparison. According to the present embodiment, the memory information written in the memory cells of one of the blocks is read, the reference cells of the other block are used, whereby a reference cell of a suitable resistance value can be selected out of the plural reference cells formed in the other block. Thus, according to the present embodiment, a magnetic memory device of higher reliability can be provided.

Modified Embodiments

The present invention is not limited to the above-described embodiment and can cover other various modifications.

For example, in the above-described embodiments, the magnetic memory cells multivalued memory information can be written in have been described by means of an example of the magnetic memory cells which can store four values information but are not limited to four values. For example, magnetic memory cells which can store eight values information may be used.

In the above-described embodiments, as the magnetoresistive effect elements, the magnetic tunnel junction element is used. However, the magnetoresistive effect elements are not limited to the magnetic tunnel junction element. For example, as the magnetoresistive effect elements, magnetoresistive effect element including two magnetic layers stacked with a conductive nonmagnetic layer formed therebetween may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A magnetic memory device comprising:
a magnetic memory cell which can store multivalued memory information, and whose electric resistance given when memory information of a first value is stored is a first resistance value, whose electric resistance given when memory information of a second value is stored is a second resistance value larger than the first resistance value, whose electric resistance given when memory information of a third value is stored is a third resistance value larger than the second resistance value and whose electric resistance given when memory information of a fourth value is stored is a fourth resistance value larger than the third resistance value;
a first reference cell whose electric resistance is set at a fifth resistance value larger than the first resistance value and smaller than the second resistance value;
a second reference cell whose electric resistance is set at a sixth resistance value larger than the second resistance value and smaller than the third resistance value;
a third reference cell whose electric resistance is set larger than the third resistance value and smaller than the fourth resistance value; and a read circuit for reading the memory information stored in the magnetic memory cell, including a first comparator comparing a signal corresponding to the electric resistance of the magnetic memory cell and a signal corresponding to the electric resistance of the first reference cell with each other, a second comparator comparing a signal corresponding to the electric resistance of the magnetic memory cell and a signal corresponding to the electric resistance of the second reference cell, and a third comparator comparing a signal corresponding to the electric resistance of the magnetic memory cell and a signal corresponding to the electric resistance of the third reference cell, wherein a direction of current flows in the first reference cell when the electric resistance of the first reference cell is set at the fifth resistance value and a direction of a current flows in the first reference cell when the memory information stored in the magnetic memory cell is read by the read circuit are the same, a direction of a current flows in the second reference cell when the electric resistance of the second reference cell is set at the sixth resistance value and a direction of a current flows in the second reference cell when the memory information stored in the magnetic memory cell is read by the read circuit are the same, a direction of a current flows in the third reference cell when the electric resistance of the third reference cell is set at a seventh resistance value and the a direction of a current flows in the third reference cell when the memory information stored in the magnetic memory cell is read by the read circuit are the same, the first reference cell includes a first magnetoresistive effect element including a first magnetization free layer to be electrically connected to a first source line via a first transistor, a first nonmagnetic layer formed on the first magnetization free layer, and a first magnetization fixed layer formed on the first nonmagnetic layer; and a second magnetoresistive effect element including a second magnetization free layer formed on the first magnetoresistive effect element, a second nonmagnetic layer formed on the second magnetization free layer, and a second magnetization fixed layer formed on the second nonmagnetic layer and electrically connected to a first bit line, the second reference cell includes a third magnetoresistive effect element including a third magnetization free layer to be electrically connected to a second source line via a second transistor, a third nonmagnetic layer formed on the third magnetization free layer, and a third magnetization fixed layer formed on the third nonmagnetic layer; and a fourth magnetoresistive effect element including a fourth magnetization free layer formed on the third magnetoresistive effect element, a fourth nonmagnetic layer formed on the fourth magnetization free layer, and a fourth magnetization fixed layer formed on the fourth no nonmagnetic layer and electrically connected to a second bit line, the third reference cell includes a fifth magnetoresistive effect element including a fifth magnetization free layer to be electrically connected to a third source line via a third transistor, a fifth nonmagnetic layer formed on the fifth magnetization free layer, and a fifth magnetization fixed layer formed on the fifth nonmagnetic layer; and a sixth magnetoresistive effect element including a six magnetization free layer formed on the fifth magnetoresistive effect element, a sixth nonmagnetic layer formed on the sixth magnetization free layer, and a sixth magnetization fixed layer formed on the sixth nonmagnetic layer and electrically connected to a third bit line, the electric resistance of the first reference cell is set at the fifth resistance by flowing a current to the first reference cell from the first bit line toward the first source line to put the first magnetoresistive effect element in a high resistance state and the second magnetoresistive effect element in the high resistance state, the electric resistance of the second reference cell is set at the sixth resistance value by flowing a current to the second reference cell from the seed bit line toward the second source line to put the third magnetoresistive effect element in the high resistance state and the fourth magnetoresistive effect element in the high resistance state, and the electric resistance of the third reference cell is set at the seventh resistance value by flowing a current to the third reference cell from the third bit line toward the third source line to put the fifth magnetoresistive effect element in the high resistance state and the sixth magnetoresistive effect element in the high resistance state.

2. The magnetic memory cell according to claim 1, wherein the read circuit further comprises a decoder outputting a signal corresponding to the memory information stored in the magnetic memory cell, based on comparison results by the first comparator, the second comparator and the third comparator.

3. The magnetic memory device according to claim 1, wherein the magnetic memory cell includes a seventh magnetoresistive effect element which includes a first magnetic layer and a second magnetic layer and become the high resistance state or the low resistance state corresponding to a magnetization direction of the second magnetic layer against a magnetization direction of the first magnetic layer, and an eighth magnetoresistive effect element which is serially connected to the seventh magnetoresistive effect element, includes a third magnetic layer and a fourth magnetic layer and becomes the high resistance state or the low resistance state corresponding to a magnetization direction of the fourth magnetic layer against a magnetization direction of the third magnetic layer.

4. The magnetic memory device according to claim 3, wherein the electric resistance of the seventh magnetoresistive effect element in the low resistance state and the electric resistance of the eighth magnetoresistive effect element in the low resistance state are different from each other, and the electric resistance of the seventh magnetoresistive effect element in the high resistance state and the electric state of the eighth magnetoresistive effect element in the high resistance state are different from each other.

5. The magnetic memory device according to claim 3, wherein the amount of a write current required to change a resistance state of the seventh magnetoresistive effect element, and the amount of the write current required to change a resistance state of the eight magnetoresistive effect element are different from each other.

6. The magnetic memory device according to claim 3, wherein a size of the seventh magnetoresistive effect element and a size of the eighth magnetoresistive effect element are different from each other.

7. The magnetic memory device according to claim 3, wherein
- a memory information of the first value is stored in the magnetic memory cell by putting the seventh magnetoresistive effect element in the low resistance state and the eighth magnetoresistive effect element in the low resistance state,
- a memory information of the second value is stored in the magnetic memory cell by putting the seventh magnetoresistive effect element in the high resistance state and the eighth magnetoresistive element in the low resistance state,
- a memory information of the third value is stored in the magnetic memory cell by putting the seventh magnetoresistive effect element in the low resistance state and the eighth magnetoresistive effect element in the high resistance state, and
- a memory information of the fourth value is stored in the magnetic memory cell by putting the seventh magnetoresistive effect element in the high resistance state and the eighth magnetoresistive effect element in the high resistance state.

8. The magnetic memory device according to claim 1, wherein
- a size of the third reference cell is larger than a size of the magnetic memory cell,
- a size of the second reference cell is larger than the size of the third reference cell, and
- a size of the first reference cell is larger than the size of the second reference cell.

9. The magnetic memory device according to claim 1, wherein
- the first comparator, the second comparator and the third comparator are respectively differential amplification-type sense amplifiers.

10. A reading method of a magnetic memory device comprising a magnetic memory cell which can store multivalued memory information, and whose electric resistance given when memory information of a first value is stored is a first resistance value, whose electric resistance given when memory information of a second value is stored is a second resistance value larger than the first resistance value, whose electric resistance given when memory information of a third value is stored is a third resistance value larger than the second resistance value and whose electric resistance given when memory information of a fourth value is stored is a fourth resistance value larger than the third resistance value; a first reference cell whose electric resistance is set at a fifth resistance value larger than the first resistance value and smaller than the second resistance value; a second reference cell whose electric resistance is set at a sixth resistance value larger than the second resistance value and smaller than the third resistance value; and a third reference cell whose electric resistance is set at a seventh resistance value larger than the third resistance value and smaller than the fourth resistance value, the method comprising:
- comparing a signal corresponding to the electric resistance of the magnetic memory cell and a signal corresponding to the electric resistance of the first reference cell with each other by a first comparator;
- comparing a signal corresponding to the electric resistance of the magnetic memory cell and a signal corresponding to the electric resistance of the second reference cell with each other by a second comparator;
- comparing a signal corresponding to the electric resistance of the magnetic memory cell and a signal corresponding to the electric resistance of the third reference cell with each other by a third comparator; and
- reading the memory information stored in the magnetic memory cell, based on comparison results by the first comparator, the second comparator and the third comparator, wherein
- a direction of a current flows in the first reference cell when the memory information stored in the magnetic memory cell is read the same as the direction of a current flows in the first reference cell when the electric resistance of the first reference cell is set at the fifth resistance value,
- a direction of a current flows in the second reference cell when the memory information stored in the magnetic memory cell is read is the same as a direction of a current flows in the second reference cell when the electric resistance of the second reference cell is set at the sixth resistance value,
- a direction of current flows in the third reference cell when the memory information stored in the magnetic memory cell is read is the same as the direction of a current flows in the third reference cell when the electric resistance of the third reference cell is set at the seventh resistance value,
- the first reference cell includes a first magnetoresistive effect element including a first magnetization free layer to be electrically connected to a first source line via a first transistor, a first nonmagnetic layer formed on the first magnetization free layer, and a first magnetization fixed layer formed on the first nonmagnetic layer; and a second magnetoresistive effect element including a second magnetization free layer formed on the first magnetoresistive effect element, a second nonmagnetic layer formed on the second magnetization free layer, and a second magnetization fixed layer formed on the second nonmagnetic layer and electrically connected to a first bit line,
- the second reference cell includes a third magnetoresistive effect element including a third magnetization free layer to be electrically connected to a second source line via a second transistor, a third nonmagnetic layer formed on the third magnetization free layer, and a third magnetization fixed layer formed on the third nonmagnetic layer; and a fourth magnetoresistive effect element including a fourth magnetization free layer formed on the third magnetoresistive effect element, a fourth nonmagnetic layer formed on the fourth magnetization free layer, and a fourth magnetization fixed layer formed on the fourth nonmagnetic layer and electrically connected to a second bit line,
- the third reference cell includes a fifth magnetoresistive effect element including a fifth magnetization free layer to be electrically connected to a third source line via a third transistor, a fifth nonmagnetic formed on the fifth magnetization free layer, and a fifth magnetization fixed layer formed on the fifth nonmagnetic layer; and a sixth magnetoresistive effect element including a six magnetization free layer formed or the fifth magnetoresistive effect element, a sixth nonmagnetic layer formed on the sixth magnetization free layer, and a sixth magnetization layer formed on the sixth nonmagnetic layer and electrically connected to a third bit line,
- the electric resistance of the first reference cell is set at the fifth resistance value by flowing a current to the first reference cell from the first hit line toward the first source line to put the first magnetoresistive effect element in a high resistance state and second magnetoresistive effect element in the high resistance state, the electric resistance of the second reference cell is set at the sixth resistance value by flowing a current to the second reference from the second bit line toward the second source line to put the third magnetoresistive effect element in the high resistance state and the fourth magnetoresistive effect element in the high resistance state, and the electric resistance of the third reference cell is set at the seventh resistance value by flowing a current to the reference cell from the third bit line toward the third source line to put the fifth magnetoresistive effect element in the high resistance state and the sixth magnetoresistive effect element in the high resistance state.

11. The reading method of a magnetic memory device according to claim 10, wherein the magnetic memory cell, the first reference cell, the second reference cell and the third reference cell are formed in a plurality of blocks, respectively, and when memory information stored in the magnetic memory cell formed in one block of said plurality of blocks is read, a signal corresponding to an electric resistance of the magnetic memory cell formed in said one block and a signal corresponding to an electric resistance of the first reference cell formed in another block of said plurality of blocks are compared with each other by the first comparator, a signal corresponding to an electric resistance of the magnetic memory cell formed in said one block and a signal corresponding to an electric resistance of the second reference cell formed in said another block are compared by the second comparator, and a signal corresponding to an electric resistance of the magnetic memory cell formed in said one block and a signal of an electric resistance of the third reference cell formed in said another block are compared by the third comparator.

12. The reading method of the magnetic memory device according to claim 11, wherein the first reference cell, the second reference cell and the third reference cell are formed in said plurality of blocks, respectively, a signal corresponding to the electric resistance of the first reference cell formed in said another block is a signal corresponding to an electric resistance of one reference cell selected out of a plurality of first reference cells formed in said another block, a signal corresponding to the electric resistance of the second reference cell formed in said another block is a signal corresponding to an electric resistance of one second reference cell selected out of a plurality of second reference cells formed in said another block, and a signal corresponding to the electric resistance of the third reference cell formed in said another block is a signal corresponding to an electric resistance of one third reference cell selected out of a plurality of third reference cells formed in said another block.

13. A magnetic memory device comprising:

a magnetic memory cell which can store multivalued memory information, and whose electric resistance given when memory information of a first value is stored is a first resistance value, whose electric resistance given when memory information of a second value is stored is a second resistance value larger than the first resistance value, whose electric resistance given when memory information of a third value is stored is a third resistance value larger than the second resistance value and whose electric resistance given when memory information of a fourth value is stored is a fourth resistance value larger than the third resistance value;

a first reference cell whose electric resistance is set at a fifth resistance value larger than the first resistance value and smaller than the second resistance value;

a second reference cell whose electric resistance is set at a sixth resistance value larger than the second resistance value and smaller than the third resistance value;

a third reference cell whose electric resistance is set larger than the third resistance value and smaller than the fourth resistance value; and a read circuit for reading the memory information stored in the magnetic memory cell, including a first comparator comparing a signal corresponding to the electric resistance of the magnetic memory cell and a signal corresponding to the electric resistance of the first reference cell with each other, a second comparator comparing a signal corresponding to the electric resistance of the magnetic memory cell and a signal corresponding to the electric resistance of the second reference cell, and a third comparator comparing a signal corresponding to the electric resistance of the magnetic memory cell and a signal corresponding to the electric resistance of the third reference cell, wherein the magnetic memory cell, the first reference cell, the second reference cell and the third reference cell are formed in a plurality of blocks, respectively, a signal corresponding to an electric resistance of the magnetic memory cell formed in one block of said plurality of blocks and a signal corresponding to an electric resistance of the first reference cell formed in another block of said plurality of blocks are compared by the first comparator, a signal corresponding to an electric resistance of the magnetic memory cell formed in said one block and a signal corresponding to an electric resistance of the second reference cell formed in said another block are compared by the second comparator, a signal corresponding to an electric resistance of the magnetic memory cell formed in said one block and a signal corresponding to an electric resistance of the third reference cell formed in said another block are compared by the third comparator, a plurality of the first reference cells, a plurality of the second reference cells and a plurality of the third reference cells are formed in said plurality of blocks, respectively, the signal corresponding to the electric resistance of the first reference cell formed in said another block is a signal corresponding to an electric resistance of one first reference cell selected out of said plurality of first reference cells formed in said another block, the signal corresponding to the electric resistance of the second reference cell formed in said another block is a signal corresponding to the electric resistance of one second reference cell selected out of said plurality of second reference cells formed in said another block, and the signal corresponding to the electric resistance of the third reference cell formed in said another block is a signal corresponding to the electric resistance of one third reference cell selected out of said plurality of third reference cells formed in said another block.

* * * * *